(12) United States Patent
Li

(10) Patent No.: US 12,710,471 B2
(45) Date of Patent: Aug. 18, 2026

(54) SEMICONDUCTOR PACKAGE

(71) Applicant: YANGTZE MEMORY TECHNOLOGIES CO., LTD., Wuhan (CN)

(72) Inventor: Zhiguo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 346 days.

(21) Appl. No.: 18/387,790

(22) Filed: Nov. 7, 2023

(65) Prior Publication Data

US 2025/0076368 A1 Mar. 6, 2025

Related U.S. Application Data

(63) Continuation of application No. PCT/CN2023/115809, filed on Aug. 30, 2023.

(51) Int. Cl.
*G01R 31/28* (2006.01)
*H10P 74/00* (2026.01)

(52) U.S. Cl.
CPC ..... *G01R 31/2879* (2013.01); *G01R 31/2856* (2013.01); *H10P 74/277* (2026.01)

(58) Field of Classification Search
CPC ................ G01R 31/26; G01R 31/2642; G01R 31/2648; G01R 31/2831; G01R 31/31702
See application file for complete search history.

(56) References Cited

U.S. PATENT DOCUMENTS

2012/0326680 A1* 12/2012 Burns ................. H02M 3/1584 323/224
2013/0228867 A1 9/2013 Suematsu et al.
2019/0295624 A1* 9/2019 Song ........................ G11C 7/20

FOREIGN PATENT DOCUMENTS

CN 110890341 A 3/2020
CN 211264963 U 8/2020
JP 2017097414 A 6/2017

* cited by examiner

*Primary Examiner* — Tung X Nguyen
(74) *Attorney, Agent, or Firm* — BAYES PLLC

(57) ABSTRACT

According to one aspect of the present disclosure, a semiconductor package is provided. The semiconductor package may include a first semiconductor chip. The semiconductor package may include at least one second semiconductor chip. The semiconductor package may include a switch protection circuit having a first end connected with the first semiconductor chip and a second end connected with each of the at least one second semiconductor chip. When the semiconductor package is undergoing a charged device model (CDM) discharge, the switch protection circuit may be in an off state to disconnect the first semiconductor chip and the second semiconductor chip.

20 Claims, 24 Drawing Sheets

900-1 connected with 901
900-2 connected with 902
1101-2 connected with 903
900-3 connected at the line for connecting 1101-2 with 903
1101-1 connected at the line for connecting 900-2 with 902

1101-2 connected with 1102-2
1102-1 connected with 903
900-3 connected at the line for connecting 1101-2 with 1102-2

1400-1 connected with 1401
1400-2 connected with 1402
1501-2 connected with 1502-2
1502-1 connected with 1302
1501-1 connected at the line for connecting 1400-2 with 1402
1400-3 connected at the line for connecting 1501-2 with 1502-2

1704-1 connected with 1801
1704-2 connected with 1802
1806-1 connected with 1805
1804-2 connected with 1806-2
1704-3 connected at the line for connecting 1804-2 with 1806-2
1804-1 connected at the line for connecting 1704-2 with 1803

1704-1 connected with 2101
1704-2 connected with 2102
2106-1-1 connected with 2105
2104-2 connected with 2106-2
1704-3 connected at the line for connecting 2104-2 with 2106-2
2104-1 connected at the line for connecting 1704-2 with 2103

SEMICONDUCTOR PACKAGE

CROSS-REFERENCE TO RELATED APPLICATIONS

This application is a continuation of International Application No. PCT/CN2023/115809, filed on Aug. 30, 2023, which is incorporated herein by reference in its entirety.

TECHNICAL FIELD

The present disclosure relates to the field of storage technology, in particular to semiconductor packages.

BACKGROUND

Integrated circuit (IC) chips are vulnerable to a destructive electro-static discharge (ESD) in fabrication, assembly, and test or final application thereof. Consequently, the IC chips are subjected to electro-static damage. At present, protections for the IC chips against ESD need to be optimized further to satisfy requirements.

SUMMARY

According to one aspect of the present disclosure, a semiconductor package is provided. The semiconductor package may include a first semiconductor chip. The semiconductor package may include at least one second semiconductor chip. The semiconductor package may include a switch protection circuit having a first end connected with the first semiconductor chip and a second end connected with each of the at least one second semiconductor chip. When the semiconductor package is undergoing a charged device model (CDM) discharge, the switch protection circuit may be in an off state to disconnect the first semiconductor chip and the second semiconductor chip.

In some implementations, when the semiconductor package is in a normal operation, the switch protection circuit may be in an on state to connect the first semiconductor chip and the second semiconductor chip.

In some implementations, the switch protection circuit may be disposed in the first semiconductor chip and may include a first sub-circuit. In some implementations, a first end of the first sub-circuit may be connected with a first node in the first semiconductor chip. In some implementations, a second end of the first sub-circuit may be connected with a second node in the first semiconductor chip. In some implementations, a control end of the first sub-circuit may be fed with a first control signal. In some implementations, the first sub-circuit may be in an off state when being fed with the first control signal of a first state, or the first sub-circuit may be in an on state when being fed with the first control signal of a second state. In some implementations, when the first sub-circuit may be in the off state, the first semiconductor chip and the second semiconductor chip are disconnected. In some implementations, when the first sub-circuit may be in the on state, the first semiconductor chip and the second semiconductor chip are connected.

In some implementations, the switch protection circuit may further include a second sub-circuit. In some implementations, the second sub-circuit may include a first capacitive element having a first end connected between the second end of the first sub-circuit and the second node in the first semiconductor chip and a second end connected with a third node in the first semiconductor chip. In some implementations, the control end of the first sub-circuit may be connected between the second end of the first capacitive element and the third node.

In some implementations, the switch protection circuit may further include a second sub-circuit. In some implementations, the second sub-circuit may include a second capacitive element having a first end connected between the second end of the first sub-circuit and the second node in the first semiconductor chip and a second end connected with a first node in a certain second semiconductor chip. In some implementations, the control end of the first sub-circuit may be connected between the second end of the second capacitive element and the first node in the certain second semiconductor chip.

In some implementations, the second sub-circuit may further include a first resistive element having a first end connected with the third node in the first semiconductor chip and a second end connected with the second end of the first capacitive element. In some implementations, the control end of the first sub-circuit may be connected between the second end of the first capacitive element and the second end of the first resistive element.

In some implementations, the second sub-circuit may further include a second resistive element having a first end connected with the first node in the certain second semiconductor chip and a second end connected with the second end of the second capacitive element. In some implementations, the control end of the first sub-circuit may be connected between the second end of the second capacitive element and the second end of the second resistive element.

In some implementations, the first sub-circuit may include a first N-type metal oxide semiconductor (NMOS) transistor.

In some implementations, the first resistive element may include at least one resistor connected in series. In some implementations, the first capacitive element may include at least one capacitor connected in series. In some implementations, a product of a resistance value of the at least one resistor and a capacitance value of the at least one capacitor may be in a range of 1 ns-1 μs.

In some implementations, the second resistive element may include at least one resistor connected in series. In some implementations, the second capacitive element may include at least one capacitor connected in series. In some implementations, a product of a resistance value of the at least one resistor and a capacitance value of the at least one capacitor may be in a range of 1 ns-1 μs.

In some implementations, the first node in the first semiconductor chip may be connected with a grounding pad in the first semiconductor chip. In some implementations, the second node in the first semiconductor chip may be connected with a grounding pin of the first semiconductor chip. In some implementations, the third node in the first semiconductor chip may be connected with a power supply pad in the first semiconductor chip.

In some implementations, the first node in the first semiconductor chip may be connected with a grounding pad in the first semiconductor chip. In some implementations, the second node in the first semiconductor chip may be connected with a grounding pin of the first semiconductor chip. In some implementations, the first node in the certain second semiconductor chip may be connected with a power supply pad in the certain second semiconductor chip.

In some implementations, the switch protection circuit may be disposed in each of the at least one second semiconductor chip and may include a third sub-circuit. In some implementations, a first end of the third sub-circuit may be connected with a second node in the second semiconductor chip. In some implementations, a second end of the third sub-circuit may be connected with a third node in the second semiconductor chip. In some implementations, a control end of the third sub-circuit may be fed with a second control signal. In some implementations, the third sub-circuit may be in an off state when being fed with the second control signal of a first state, or the third sub-circuit may be in an on state when being fed with the second control signal of a second state. In some implementations, when the third sub-circuit is in off state, the first semiconductor chip and the second semiconductor chip are disconnected. In some implementations, when the third sub-circuit is in on state, the first semiconductor chip and the second semiconductor chip are connected.

In some implementations, the switch protection circuit may further include a fourth sub-circuit. In some implementations, the fourth sub-circuit may include a third capacitive element having a first end connected between the second end of the third sub-circuit and the third node in the second semiconductor chip and a second end connected with a first node in the second semiconductor chip. In some implementations, the control end of the third sub-circuit may be connected between the second end of the third capacitive element and the first node in the second semiconductor chip.

In some implementations, the switch protection circuit may further include a fourth sub-circuit. In some implementations, the fourth sub-circuit may include a fourth capacitive element having a first end connected between the second end of the third sub-circuit and the third node in the second semiconductor chip and a second end connected with a third node in the first semiconductor chip. In some implementations, the control end of the third sub-circuit may be connected between the second end of the fourth capacitive element and the third node in the first semiconductor chip.

In some implementations, the fourth sub-circuit may further include a third resistive element having a first end connected with the first node in the second semiconductor chip and a second end connected with the second end of the third capacitive element. In some implementations, the control end of the third sub-circuit may be connected between the second end of the third capacitive element and the second end of the third resistive element.

In some implementations, the fourth sub-circuit may further include a fourth resistive element having a first end connected with the third node in the first semiconductor chip and a second end connected with the second end of the fourth capacitive element. In some implementations, the control end of the third sub-circuit may be connected between the second end of the fourth capacitive element and the second end of the fourth resistive element.

In some implementations, the third sub-circuit may further include a second NMOS transistor.

In some implementations, the third resistive element includes at least one resistor connected in series, and the third capacitive element includes at least one capacitor connected in series, wherein a product of a resistance value of the at least one resistor and a capacitance value of the at least one capacitor is in a range of 1 ns-1 μs.

In some implementations, the fourth resistive element includes at least one resistor connected in series, and the fourth capacitive element includes at least one capacitor connected in series, wherein a product of a resistance value of the at least one resistor and a capacitance value of the at least one capacitor is in a range of 1 ns-1 μs.

In some implementations, a substrate of the first NMOS transistor is isolated from a substrate of the first semiconductor chip by a deep N-Well (DNW).

In some implementations, a substrate of the second NMOS transistor is isolated from a substrate of the second semiconductor chip by a deep N-Well (DNW).

In some implementations, the first semiconductor chip comprises an interface chip and the second semiconductor chip comprises a NAND flash chip.

According to another aspect of the present disclosure, a semiconductor package is provided. The semiconductor package may include a package housing provided with a first pin that allows a CDM discharge. The semiconductor package may include a first semiconductor chip in the package housing. The semiconductor package may include at least one second semiconductor chip in the package housing, each being connected with the first semiconductor chip via an NMOS transistor. The NMOS transistor is disposed in the first semiconductor chip or in each of the at least one second semiconductor chip. A control end of the NMOS transistor may be fed with a control signal. A state of the control signal may be controlled by whether the first pin is undergoing the CDM discharge.

In some implementations, the NMOS transistor may be disposed in the first semiconductor chip. In some implementations, a first end of the NMOS transistor may be connected with a first node in the first semiconductor chip. In some implementations, a second end of the NMOS transistor may be connected with a second node in the first semiconductor chip. In some implementations, the control end of the NMOS transistor may be fed with the control signal. In some implementations the second node in the first semiconductor chip may be connected with a first pin of the first semiconductor chip. In some implementations, the first semiconductor chip may be further connected with each of the at least one second semiconductor chip via the first pin of the first semiconductor chip.

In some implementations, the first semiconductor chip may be further provided with a first capacitive element having a first end connected between the second end of the NMOS transistor and the first pin of the first semiconductor chip and a second end connected with a third node in the first semiconductor chip. In some implementations, the control end of the NMOS transistor may be connected between the second end of the first capacitive element and the third node in the first semiconductor chip. In some implementations when the first pin of the semiconductor package is undergoing the CDM discharge, the third node in the first semiconductor chip may be floated, and the control end of the NMOS transistor may be fed with the control signal of the first state via the first capacitive element. In some implementations, when the first pin of the semiconductor package is in a normal operation, the third node in the first semiconductor chip may be fed with a power supply signal, and the control end of the NMOS transistor may be fed with the control signal of the second state via the first capacitive element.

In some implementations, the first semiconductor chip may be further provided with a second capacitive element having a first end connected between the second end of the NMOS transistor and the first pin of the first semiconductor chip and a second end connected with a first pin of the second semiconductor chip via a second pin of the first semiconductor chip. In some implementations, the control end of the NMOS transistor may be connected between the second end of the second capacitive element and the first pin of the second semiconductor chip. In some implementations, when the first pin of the semiconductor package is undergoing the CDM discharge, the first pin of the second semiconductor chip may be floated, and the control end of the NMOS transistor may be fed with the control signal of a first state via the second capacitive element. In some implementations, when the first pin of the semiconductor package is in a normal operation, the first pin of the second semiconductor chip may be fed with a power supply signal, and the control end of the NMOS transistor may be fed with the control signal of a second state via the second capacitive element.

In some implementations, the first semiconductor chip may be further provided with a first resistive element. In some implementations, a first end of the first resistive element may be connected with the third node in the first semiconductor chip, a second end of the first resistive element may be connected with the second end of the first capacitive element. In some implementations, the control end of the NMOS transistor may be connected between the second end of the first capacitive element and the second end of the first resistive element.

In some implementations, the first semiconductor chip may be further provided with a second resistive element. In some implementations, a first end of the second resistive element may be connected with the first pin of the second semiconductor chip via the second pin of the first semiconductor chip, and a second end of the second semiconductor chip may be connected with the second end of the second capacitive element. In some implementations, the control end of the NMOS transistor may be connected between the second end of the second capacitive element and the second end of the second resistive element.

In some implementations, the NMOS transistor may be disposed in each of the at least one second semiconductor chip. In some implementations, in a certain second semiconductor chip, a first end of the NMOS transistor may be connected with a second node in the second semiconductor chip. In some implementations, a second end of the NMOS transistor may be connected with a third node in the second semiconductor chip. In some implementations, the control end of the NMOS transistor may be fed with the control signal. In some implementations, the third node in the second semiconductor chip may be connected with a second pin of the second semiconductor chip. In some implementations, the second semiconductor chip may be further connected with the first semiconductor chip via the second pin of the second semiconductor chip.

In some implementations, the second semiconductor chip may be provided with a third capacitive element having a first end connected between the second end of the NMOS transistor and the second pin of the second semiconductor chip and a second end connected with a first node in the second semiconductor chip. In some implementations, the control end of the NMOS transistor may be connected between the second end of the third capacitive element and the first node in the second semiconductor chip. In some implementations, when the first pin of the semiconductor package is undergoing the CDM discharge, the first node in the second semiconductor chip may be floated, and the control end of the NMOS transistor may be fed with the control signal of a first state via the third capacitive element. In some implementations, when the first pin of the semiconductor package is in a normal operation, the first node in the second semiconductor chip may be fed with a power supply signal, and the control end of the NMOS transistor may be fed with the control signal of a second state via the third capacitive element.

In some implementations, the first semiconductor chip may be further provided with a fourth capacitive element having a first end connected between the second end of the NMOS transistor and the second pin of the second semiconductor chip and a second end connected with a third pin of the first semiconductor chip via a third pin of the second semiconductor chip. In some implementations, when the first pin of the semiconductor package is undergoing the CDM discharge, the third pin of the first semiconductor chip may be floated, and the control end of the NMOS transistor may be fed with the control signal of a first state via the third capacitive element. In some implementations, when the first pin of the semiconductor package is in a normal operation, the third pin of the first semiconductor chip may be fed with a power supply signal, and the control end of the NMOS transistor may be fed with the control signal of a second state via the third capacitive element.

In some implementations, the second semiconductor chip may be further provided with a third resistive element having a first end connected with the first node in the second semiconductor chip and a second end connected with the second end of the third capacitive element. In some implementations, the control end of the NMOS transistor may be connected between the second end of the third resistive element and the second end of the third capacitive element.

In some implementations, the second semiconductor chip may be further provided with a fourth resistive element. In some implementations, a first end of the fourth resistive element may be connected with the third pin of the first semiconductor chip via the third pin of the second semiconductor chip, and a second end of the fourth resistive element may be connected with the second end of the fourth capacitive element. In some implementations, the control end of the NMOS transistor may be connected between the second end of the fourth resistive element and the second end of the fourth capacitive element.

In some implementations, the first pin of the semiconductor package may include an input pin or an output pin.

In some implementations, the first pin of the first semiconductor chip may include a grounding pin. In some implementations, the second pin of the first semiconductor chip and the first pin of the second semiconductor chip may include a power supply pin.

In some implementations, the second pin of the second semiconductor chip may include a grounding pin. In some implementations, the third pin of the first semiconductor chip and the third pin of the first semiconductor chip may include a power supply pin.

In some implementations, the first semiconductor chip may be an interface chip and the second semiconductor chip is a NAND flash chip.

According to a further aspect of the present disclosure, an IC chip is provided. The IC chip may include a semiconductor package. The semiconductor package may include a first semiconductor chip. The semiconductor package may include at least one second semiconductor chip. The semiconductor package may include a switch protection circuit having a first end connected with the first semiconductor chip and a second end connected with each of the at least one second semiconductor chip. When the semiconductor package is undergoing a charged device model (CDM) discharge, the switch protection circuit may be in an off state to disconnect the first semiconductor chip and the second semiconductor chip.

With the semiconductor package provided in implementations of the present disclosure, when the CDM discharge is performed, the switch protection circuit may be turned off to disconnect the first semiconductor chip and the second semiconductor chip. This may prevent static charges carried by the first semiconductor chip or the second semiconductor chip from flowing into the ground in a large amount via a certain pin and causing a breakdown failure of the semiconductor chips.

BRIEF DESCRIPTION OF DRAWINGS

In the accompanying drawings drawn not necessarily to scale, like reference numerals may describe similar parts in different figures. Same numerals with different character suffixes may represent different instances of similar parts. The accompanying drawings generally illustrate various implementations discussed in the present disclosure by example rather than limitation.

DETAILED DESCRIPTION

Figure 1:
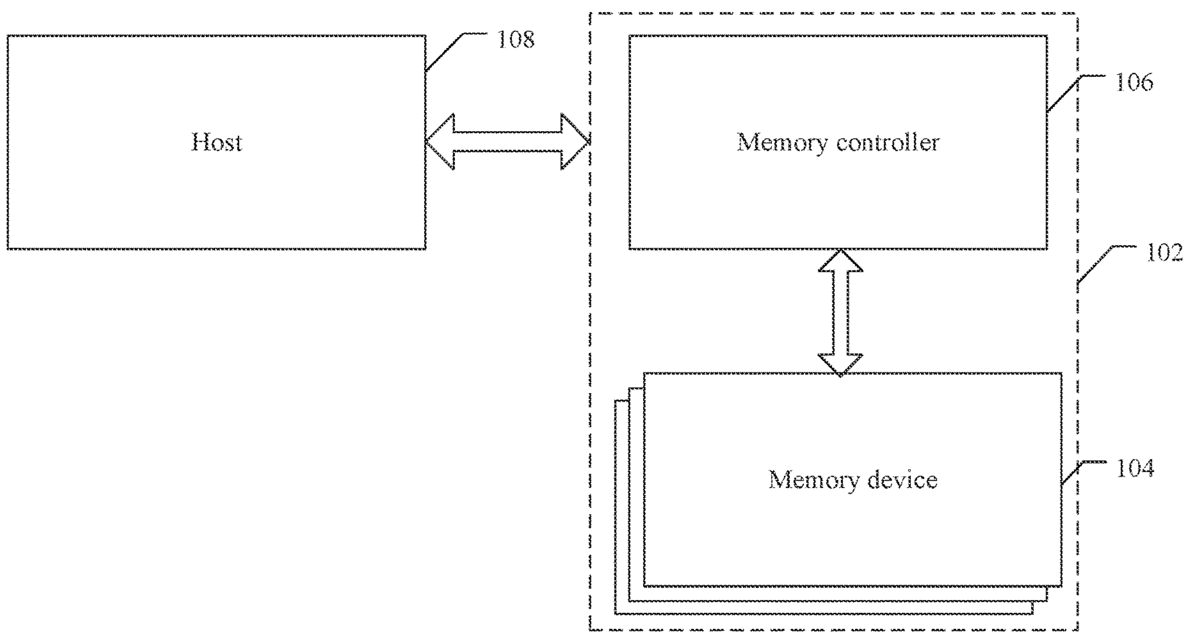
FIG. 1 is an example system block diagram of an electronic device having a memory system, according to some aspects of the present disclosure.

Implementations of the present disclosure will be described in greater detail below with reference to the accompanying drawings. Other implementations that may serve as variants of any disclosed implementations may be obtained by differently configuring or arranging elements and features in implementations of the present disclosure. Therefore, implementations of the present disclosure are not limited to implementations described in the present disclosure. In contrast, the described implementations are provided to make implementations of the present disclosure thorough and complete, and to convey the scope of implementations of the present disclosure fully to those skilled in the art to which implementations of the present disclosure belong. It is noted that references to "an implementation", "another implementation", etc. do not necessarily refer to only one implementation, and different references to any such phrases do not necessarily refer to the same implementation. It should be understood that although terms "first", "second' and "third" etc. may be used herein to identify various elements, these elements are not limited by these terms. These terms are used to distinguish one element from another element with the same or similar designation. Therefore, a first element in one implementation may also be referred to as a second or third element in another implementation without departing from the spirit and scope of implementations of the present disclosure.

The accompanying drawings are not necessarily drawn to scale, and may be drawn in an enlarged scale in certain cases to clearly illustrate features of implementations. When an element is described as connected or coupled to another element, it should be understood that the former may be directly connected or coupled to the latter, or may be electrically connected or electrically coupled to the latter via one or more intermediate elements therebetween. It should be further understood that when an element is said to be "between" two elements, the element may be the only one element between the two elements, or there may be one or more intermediate elements.

The various terms used herein are only for the purpose of describing certain implementations, but are not intended to limit the present disclosure. Singular forms as used herein are intended to include plural forms unless otherwise stated in the context. The articles "a" and/or "an" as used in implementations of the present disclosure and the appended claims should be explained as "one or more" unless stated otherwise or clearly understood as singular forms from the context. It should be further understood that terms "include", "including", "comprise", and "comprising" as used in implementations of the present disclosure mean the presence of said elements but do not exclude the presence or addition of one or more other elements. The term "and/or" as used in implementations of the present disclosure includes any and all combinations of one or more related listed items. Unless otherwise defined, all terms related to technology and science as used in implementations of the present disclosure have the same meanings as understood generally by those of ordinary skill in the art in view of implementations of the present disclosure. It should be further understood that unless clearly defined in implementations of the present disclosure, terms should be explained as having meanings consistent with meanings in the environments of implementations of the present disclosure and related technology as defined in common dictionaries rather than being explained in an ideal or over formal manner.

In the following description, many specific details are set forth to provide a thorough understanding of the present disclosure. However, the present disclosure may be practiced without some or all of the specific details. In other cases, known processing structures and/or processing are not described in detail to avoid obscuring the present disclosure unnecessarily. It should be further understood that in certain cases, unless otherwise stated, it should be obvious to those skilled in the art that features or elements described with respect to one implementation may be used separately or in combination with other features or elements in another implementation. In the following, implementations of the present disclosure will be described in detail with reference to accompanying drawings. The following description focuses on details to facilitate understanding implementations of the present disclosure. Well-known technical details may be omitted to avoid obscuring features and aspects of implementations of the present disclosure unnecessarily.

Implementations of the present disclosure provide a semiconductor package (including an IC chip) including a switch protection circuit. When the CDM discharge is performed, the switch protection circuit can prevent static charges carried by a semiconductor chip in the package from flowing into a certain semiconductor chip in a large amount, thereby avoiding a breakdown failure of the semiconductor chip and the semiconductor package.

FIG. 1 illustrates a block diagram of an example system having a memory device as provided according to an implementation of the present disclosure. In FIG. 1, the system 100 may be a mobile phone, a desktop computer, a laptop computer, a tablet, a vehicle computer, a gaming console, a printer, a positioning device, a wearable electronic device, a smart sensor, a virtual reality (VR) device, an augmented reality (AR) device, or any other suitable electronic device having a storage therein. As shown in FIG. 1, the system 100 may include a host 108 and a memory system 102. The memory system 102 may have one or more memory devices 104 and a memory controller 106, and the host 108 may be a processor of an electronic device such as a central processing unit (CPU), or a system-on-chip (SoC) such as an application processor (AP). The host 108 may be configured to send data to the memory device 104 or receive data from the memory device 104. For example, the memory device 104 may be any of the memories disclosed in the present disclosure, such as a phase change random access memory (PCRAM), a three dimension NAND flash, etc.

According to some implementations, the memory controller 106 is coupled to the memory device 104 and the host 108, and is configured to control the memory device 104. The memory controller 106 can manage the data stored in the memory device 104 and communicate with the host 108. In some implementations, the memory controller 106 is designed to operate in a low duty-cycle environment, e.g., such as secure digital (SD) cards, compact Flash (CF) cards, universal serial bus (USB) Flash drives, or other media for use in electronic devices operated in the low duty-cycle environment, e.g., such as personal computers, digital cameras, mobile phones, etc. In some implementations, the memory controller 106 is designed to operate in a high duty-cycle environment such as solid-state drives (SSDs) or embedded multimedia cards (eMMCs). The SSDs or eMMCs may be used as, e.g., data storages of the mobile devices operated in the high duty-cycle environment such as smart phones, tablet computers and laptop computers, and enterprise memory arrays. The memory controller 106 can be configured to control operations of the memory device 104. These operations may include, e.g., read, erase, and program operations. The memory controller 106 can also be configured to manage various functions with respect to the data stored or to be stored in the memory device 104 including, but not limited to, bad-block management, garbage collection, logical-to-physical address conversion, wear leveling, etc. In some implementations, the memory controller 106 is further configured to process error correction codes (ECCs) with respect to the data read from or written to the memory device 104. Any other suitable functions may be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2:
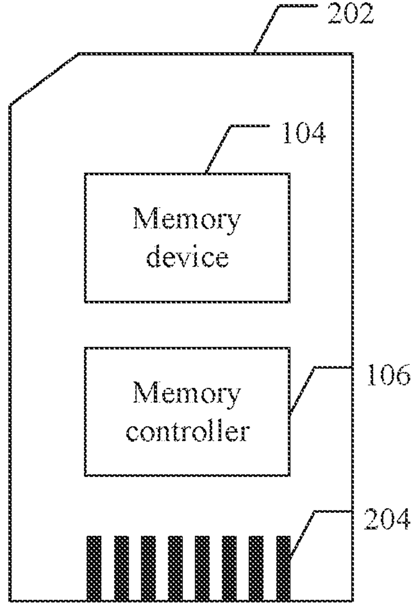
FIG. 2 is a schematic diagram of an example memory card having a memory, according to some aspects of the present disclosure.

Memory controller 106 and one or more memory devices 104 can be integrated into various types of storage devices, for example, be included in the same package, such as a universal Flash storage (UFS) package or an eMMC package. That is, the memory system 102 can be implemented and packaged into different types of end electronic products. In one example as shown in FIG. 2, the memory controller 106 and a single memory device 104 can be integrated into a memory card 202. The memory card may include a Personal Computer (PC) card (e.g., Personal Computer Memory Card International Association (PCMCIA) card), a CF card, a smart media (SM) card, a memory stick, a Multi-Media card (MMC), Reduced-Size MMC (RS-MMC), MMCmicro, an Secure Digital (SD) card (e.g., miniSD, microSD, Secure Digital High Capacity (SDHC)), Universal Flash Storage (UFS), etc.

Figure 3:
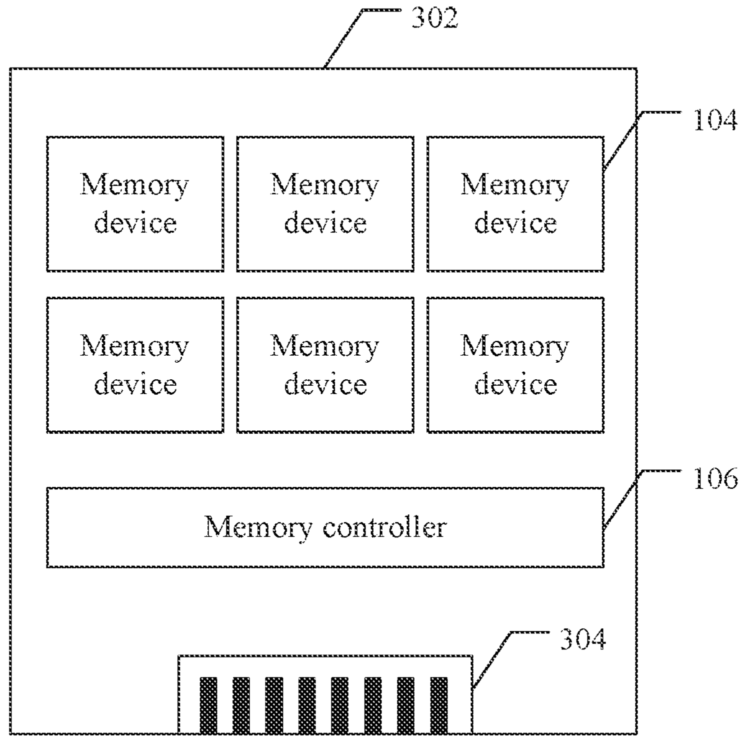
FIG. 3 is a schematic diagram of an example SSD having a memory as provided, according to some aspects of the present disclosure.

The memory card may also include a memory card connector 204 coupling the memory card and the host (e.g., the host 108 in FIG. 1). In another example as shown in FIG. 3, the memory controller 106 and multiple memory devices 104 can be integrated into an SSD 302. The SSD may also include a SSD connector 304 coupling the SSD and the host (e.g., the host 108 in FIG. 1). In some implementations, the memory capacity and/or operating speed of the SSD are greater than the memory capacity and/or operating speed of the memory card. Furthermore, the memory controller 106 can be further configured to control read, erase, and write operations of the memory device 104.

The above-described memory device and memory system include many IC chips such as interface chips or NAND flash chips described below, which are vulnerable to a destructive ESD in fabrication, assembly, test, and use of the IC chips. The ESD is generated by static electricity carried by the IC chips themselves, and may be produced by a single pin of an IC chip. With respect to this type of ESD, a charged device model (CDM) protection circuit may be fabricated for ESD protection. When the IC chip is performing the CDM discharge, an external circuit connected with the IC chip also carries static charges. Then, the static charges carried by the external circuit also flow to the IC chip and are discharged via the pin of the IC chip. At this time, static charges through the pin of the IC chip would inevitably increase, which may cause a breakdown failure of the pin of the IC chip. That is, at present, the protection capability of CDM protection circuit of a semiconductor chip (or package) containing an IC chip is influenced by the connected other semiconductor chips (or circuits) carrying static charges, resulting in poor effects, which may cause a breakdown failure of the pin of the IC chip.

Figure 4:
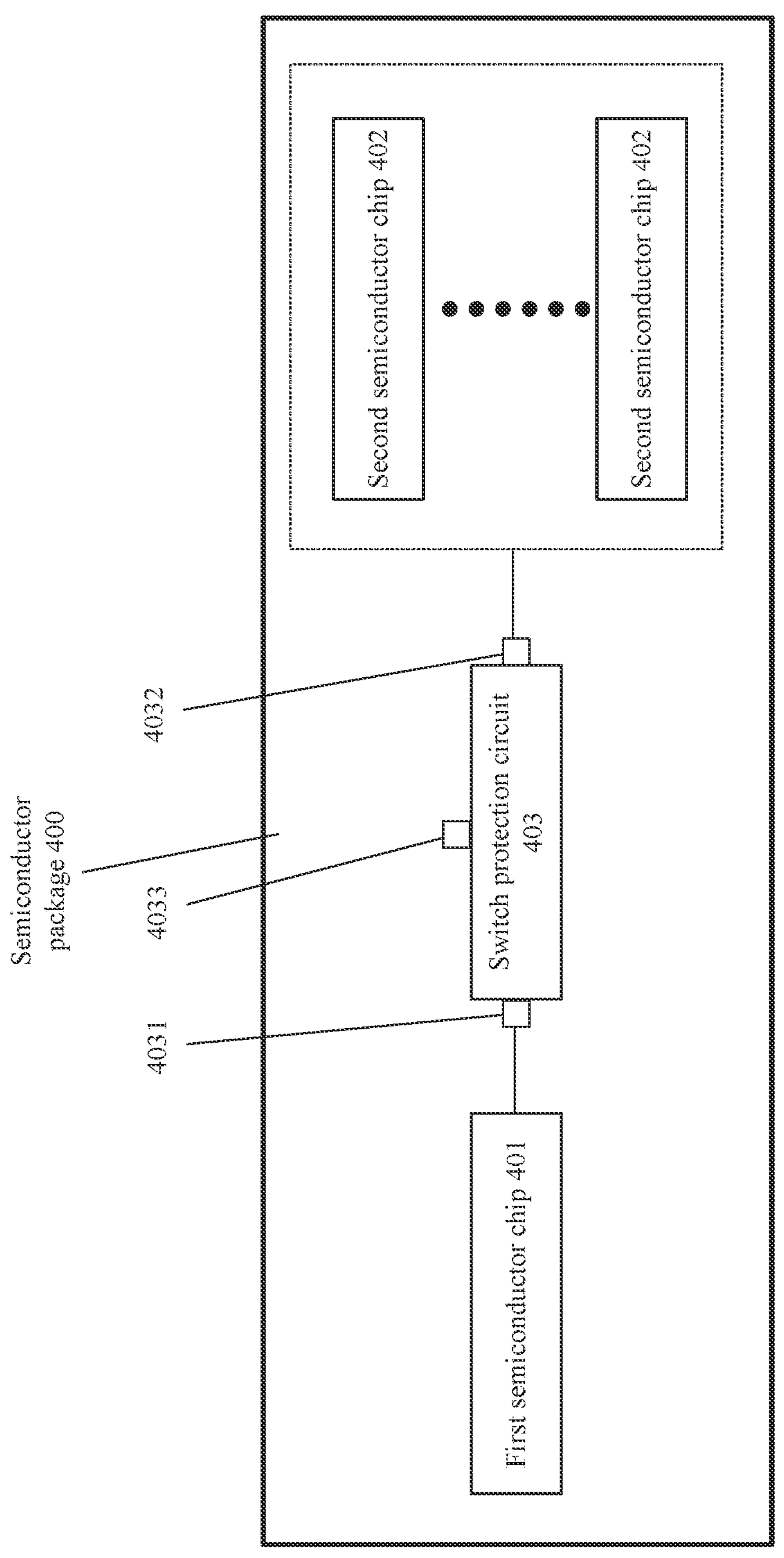
FIG. 4 is a schematic diagram I of a structure of a semiconductor package, according to some aspects of the present disclosure.

In order to address the above-described one or more problems, as shown in FIG. 4, an implementation of the present disclosure provides a semiconductor package 400. Semiconductor package 400 may include first semiconductor chip 401, at least one second semiconductor chip 402, and a switch protection circuit 403. The switch protection circuit 403 may have a first end 4031 connected with the first semiconductor chip 401 and a second end 4032 connected with each of the at least one second semiconductor chip 402. The switch protection circuit 403 may be in an off state when the semiconductor package 400 is undergoing a CDM discharge to disconnect the first semiconductor chip 401 and the second semiconductor chip 402.

In some implementations, the switch protection circuit 403 may further include a third end 4033 that may be input a control signal to control on or off of the switch protection circuit 403, which will be described below and will not be described in detail anymore.

Here, the first semiconductor chip 401 may include an interface chip and the second semiconductor chip 402 includes a memory chip. The interface chip may refer to a chip having an internal interface circuit. For example, the internal interface circuit may have at least one of the following functions: a) setting registering, buffering logics for data to accommodate speed difference between the memory controller and the memory device; b) converting information format such as serial and parallel format formats; and/or c) coordinating type and level difference in information between memory controller and memory device such as horizontal conversion driving, DA conversion or AD conversion. The memory chip may refer to the specific application of the concept of an embedded system chip in the memory industry. For example, the afore-mentioned NAND flash chip having a NAND memory array may be one of the memory chips.

The semiconductor package 400 may refer to the structure formed by packaging a plurality of semiconductor chips in a package board (or package structure). For example, in the present disclosure, one first semiconductor chip and at least one second semiconductor chip are packaged in one package board to form a semiconductor package. In practical applications, as integrated circuits develop, packaging modes develop also, and the number of chips in the package increases. The packaging modes may include DDP (double die package), QDP (quarter die package), ODP (octo-die package), HDP (hexadeca-die package), etc. As additional memory chips are integrated in a package, a load of a signal (DQ) pin of the package structure facing outwards also increases, which limits the operating speed of the DQ. For example, as additional NAND chips are integrated in a package, the load of a signal (DQ) pin of the package structure facing outwards becomes larger, which limits the operating speed of the DQ. In some implementations, a plurality of NAND chips are packaged in a Combo-NAND manner. The Combo-NAND packaging manner may mean that besides conventional NAND chips, one or more interface (or buffer) chips are integrated in the package for processing and transferring of signals inside and outside the NANDs and package, optimizing timing of NAND chips, thereby allowing high speed operation of signal pins of the package, which has become the development trend of large capacity and high speed NAND products. For example, this is shown in FIGS. 5 and 6.

Figure 5:
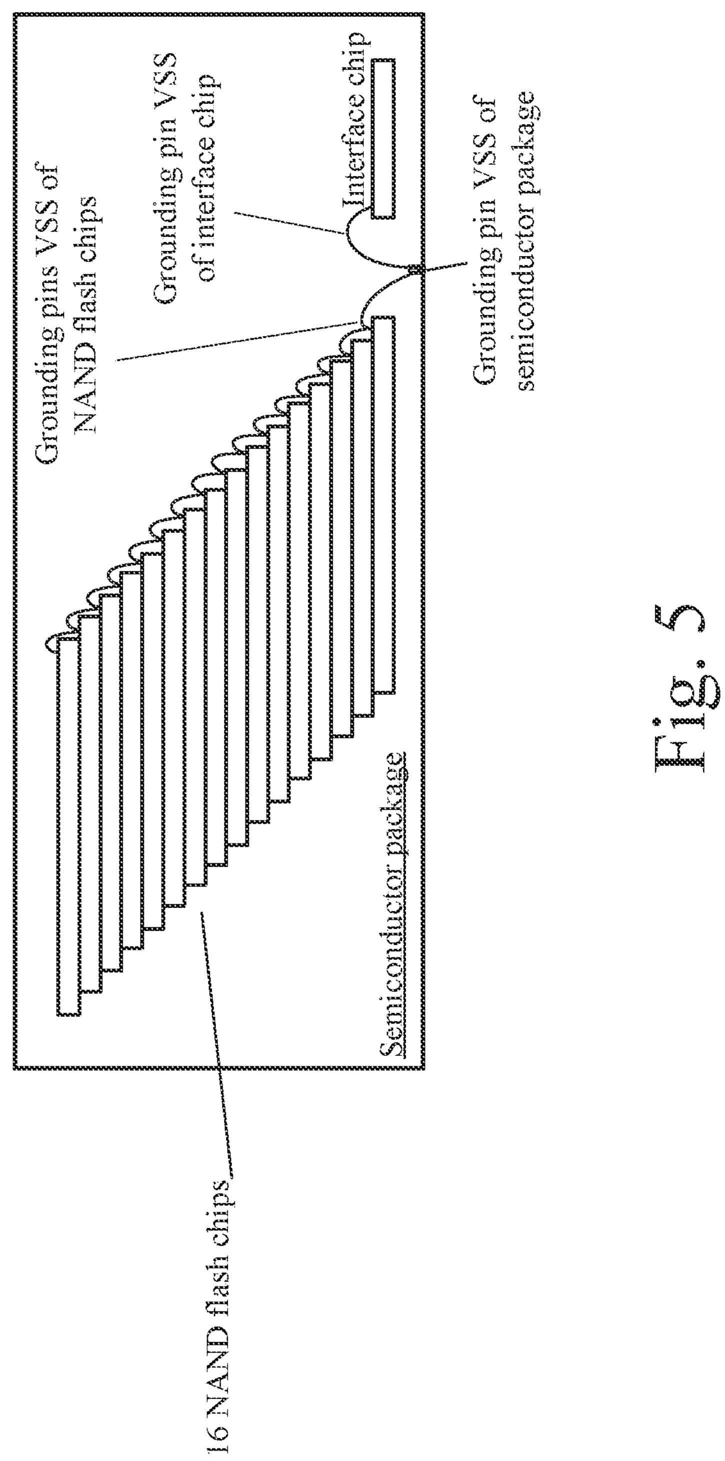
FIG. 5 is a schematic diagram I of a structure of a NAND package, according to some aspects of the present disclosure.

FIG. 5 is a schematic diagram I of a structure of a NAND package, according to some aspects of the present disclosure. FIG. 5 shows a global low voltage (global VSS) scheme after the Combo-NAND packaging. For example, in the global VSS aspect, on the one hand, VSSes of NAND chips are connected with each other via bonding wires and then are connected to VSS pin of the package. On the other hand, VSS of an interface chip is also connected to the VSS pin of the package via a bonding wire. Therefore, VSSes of all NAND chips and interface chip are connected together, and thus, substrates of all these chips are also connected together.

Figure 6:
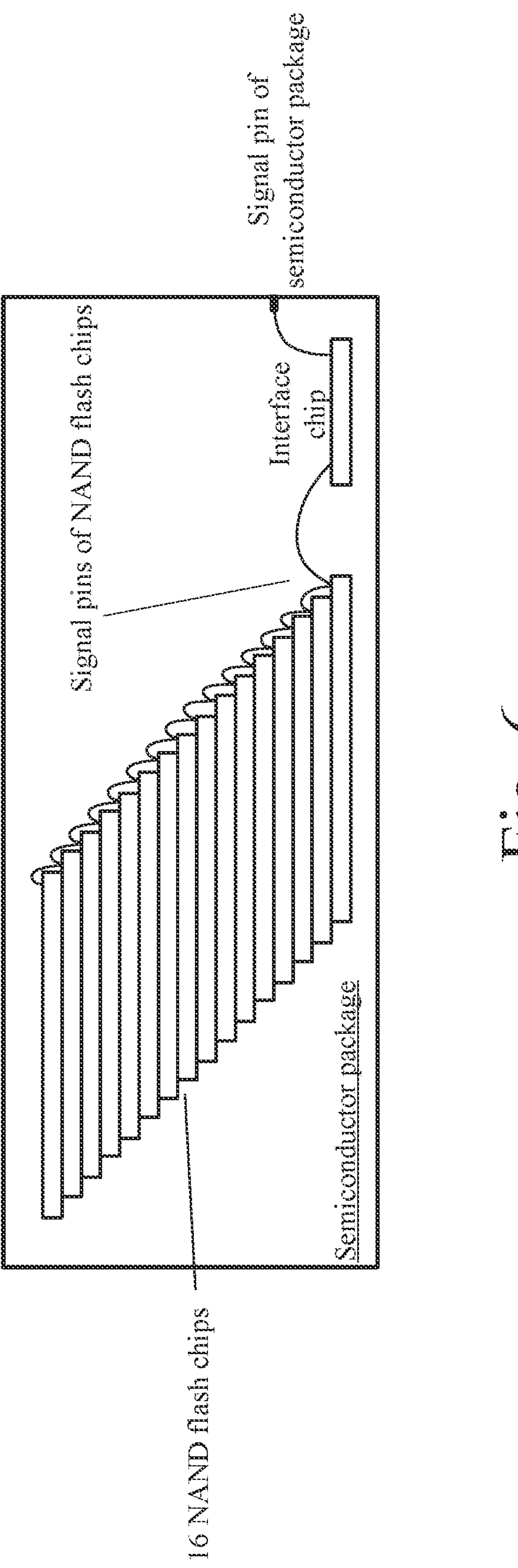
FIG. 6 is a schematic diagram II of a structure of a NAND package, according to some aspects of the present disclosure.

FIG. 6 is a schematic diagram II of a structure of a NAND package, according to some aspects of the present disclosure. FIG. 6 shows a signal scheme for the Combo-NAND. In the package, each of signal pins of NAND chips is firstly connected to an interface chip, and after being processed by the interface chip for an optimizing timing, is connected to a signal pin of the package via a signal pin of the interface chip. That is, the NAND chip is not directly connected to the signal pin of the package, and only the signal pin of the interface chip is connected to the signal pin of the package.

Figure 7:
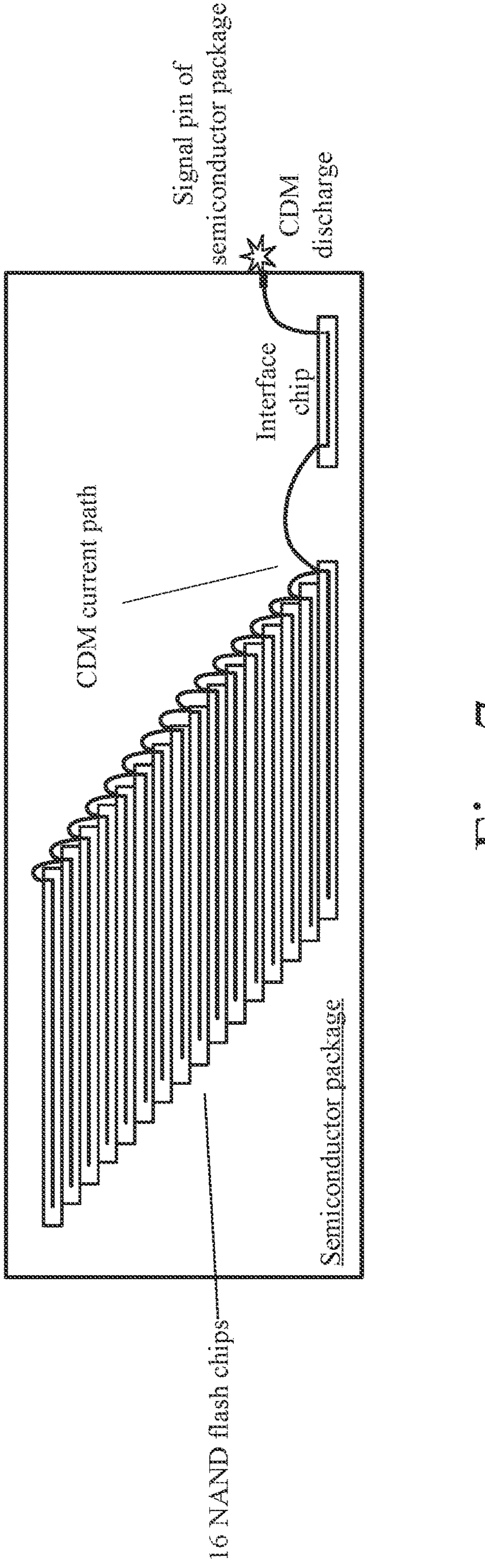
FIG. 7 is a schematic diagram of a CMD discharge of a NAND package, according to some aspects of the present disclosure.
Figure 8:
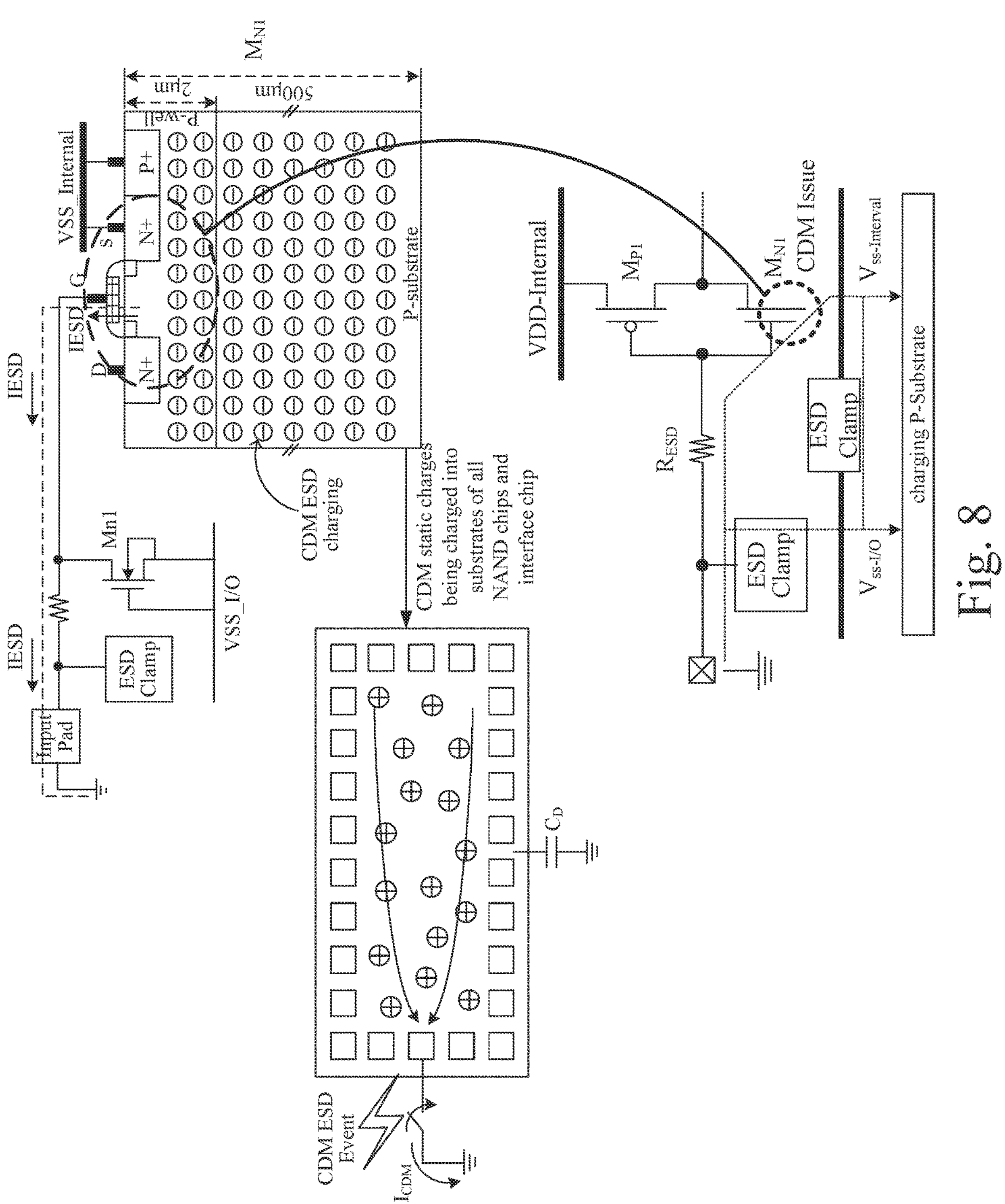
FIG. 8 is a schematic diagram of a path of a CMD discharge of a NAND package, according to some aspects of the present disclosure.

For a semiconductor package adopting the Combo-NAND packaging manner as described above in FIGS. 5 and 6, the above technical problem (a pin breakdown failure of an IC chip caused by a CDM discharge of the IC chip) as proposed in the present disclosure also exists, and is more severe. For example, as shown in FIGS. 7 and 8, they are schematic diagrams of a CMD discharge of a NAND package as provided according to some aspects of the present disclosure. As shown in FIGS. 7 and 8, before a CDM electro-static discharge (ESD) of a certain signal pin of the package, all chips (NAND chips and interface chip) in the package will be filled with static charges, and when a pin of the package performs a CDM discharge, static charges accumulated in chip substrates will be released to outside of the chips quickly via the pin of the package. Since the CDM current is large (e.g., several to tens of Amperes), a high voltage difference is generated across an input gate to cause a breakdown failure of the input gate. The CDM of a pin outside the Combo-NAND package is protected by an ESD of a pin of the interface chip. Since the substrates of the NAND chips and interface chip are connected together, static charges in all NAND chip substrates will also be released via the ESD of the pin of the interface chip. In the package, static charges of all together 17 chips are discharged by the ESD of the pin of one interface chip, which exceeds the protection capability of the ESD of the pin of the interface chip and would cause an ESD breakdown failure of the package pin. One approach to address the above-described problem may be increasing the ESD size of the interface chip to 17 times larger, which may not be effective. Even if effective, this would result in an undesirable parasitic capacitance of the pin, severely influencing the signal transferring speed. This may reduce the timing optimization of the Combo-NAND to be lost, which is not acceptable. Furthermore, the CDM failure caused by the Combo-NAND also occurs inside the NAND chip or at the interface between the NAND chip and the buffer chip, which is not detectable by a conventional IV test of the package pin after the ESD, and is likely to be neglected and becomes a hidden trouble in the product application. It is to be noted that FIG. 8 shows a principal structure of the CDM discharge in the package structures shown in FIGS. 5 to 7.

Based on this, a switch protection circuit 403 is added in the semiconductor package of the present disclosure, and when the semiconductor package 400 performs a charged device model (CDM) discharge, the switch protection circuit 403 is in off state to disconnect the first semiconductor chip 401 and the second semiconductor chip 402 such that static charges carried by the second semiconductor chip are blocked to flow into the first semiconductor chip, and thus, are blocked to flow into a pin of the semiconductor package via a pin of the first semiconductor chip, thereby avoiding a breakdown failure of pins of the first semiconductor chip and the semiconductor package. It is noted that the static charges carried by the second semiconductor chip (e.g., such as a NAND chip) and the first semiconductor chip (e.g., such as an interface chip) may be accumulated in a normal operation of the semiconductor package, or charged in CDM test for testing the pins' ESD withstanding capability before the semiconductor package leaves factory.

In some implementations, when the semiconductor package is in a normal operation, the switch protection circuit is in an on state to connect the first semiconductor chip and the second semiconductor chip.

It is noted that the CDM discharge of the semiconductor package is only an operating state thereof for the ESD protection. The semiconductor package operates normally for most of the time, such as read operation, write operation, erase operation, etc. In its normal operation, the switch protection circuit would not influence the normal operation. That is, the switch protection circuit is in an on state when the semiconductor package is normally operated to connect the first semiconductor chip and the second semiconductor chip, guaranteeing the normal operation of the semiconductor package.

That is, the semiconductor package may be in a CDM discharge or in a normal operation, which are two independent operation modes of the semiconductor package. At a time, only one mode is allowed. That is, when the semiconductor package is in the CDM discharge, it will not be in the normal operation, and when the semiconductor package is in the normal operation, it will not be in the CDM discharge.

For the configuration and structure of the switch protection circuit, there may be the following several schemes.

Figure 9:
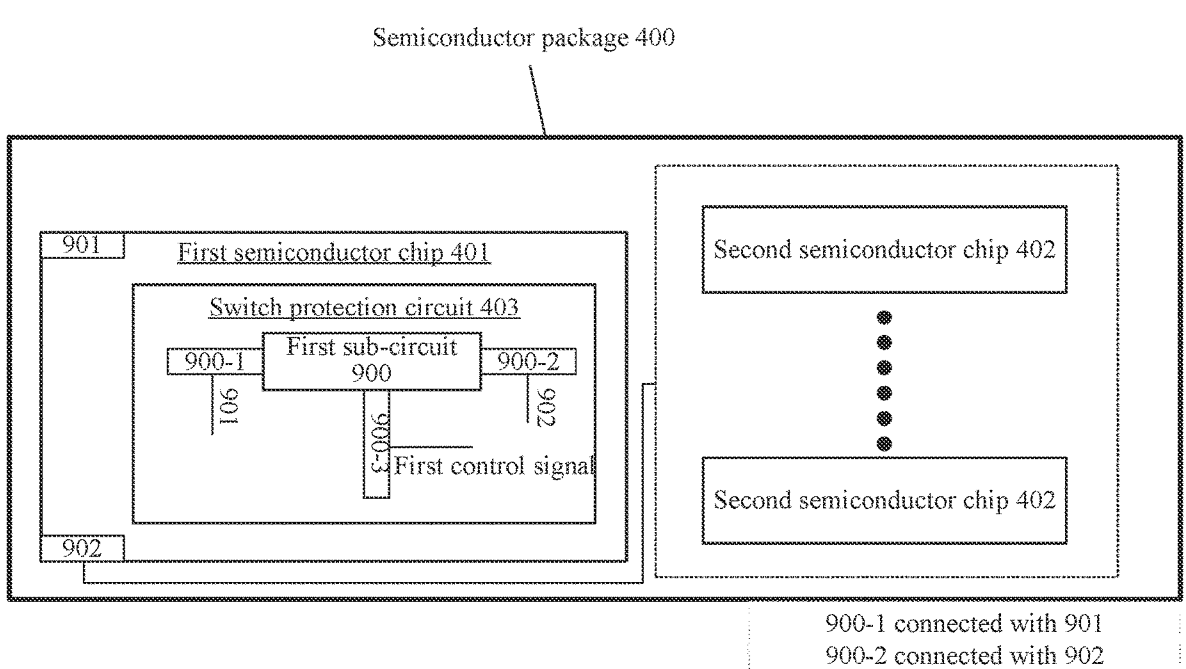
FIG. 9 is a schematic diagram II of a structure of a semiconductor package, according to some aspects of the present disclosure.

For example, in some implementations, as shown in FIG. 9, the switch protection circuit 403 is disposed in the first semiconductor chip 401 and includes a first sub-circuit 900. A first end 900-1 of the first sub-circuit is connected with a first node 901 in the first semiconductor chip, a second end 900-2 of the first sub-circuit is connected with a second node 902 in the first semiconductor chip, and a control end 900-3 of the first sub-circuit is fed with the first control signal. The first sub-circuit is in an off state when being fed with the first control signal of a first state, or the first sub-circuit is in an on state when being fed with the first control signal of a second state. When the first sub-circuit is in the off state, the first semiconductor chip and the second semiconductor chip are disconnected. When the first sub-circuit is in the on state, the first semiconductor chip and the second semiconductor chip are connected.

Here, the first node 901 in the first semiconductor chip may be connected with the grounding pad in the first semiconductor chip, the second node 902 in the first semiconductor chip may be connected with the grounding pin of the first semiconductor chip, and the third node in the first semiconductor chip may be connected with the power supply pad in the first semiconductor chip.

The described grounding pad may refer to for example the pad for connecting with the grounding (GND). The grounding pin of the first semiconductor chip may refer to the pin for connecting with the GND, which is exposed to the outside after the first semiconductor chip is packaged. The power supply pad may be for example the pad for being fed with a power supply signal such as a voltage signal.

Here, the first sub-circuit may include a first N-type metal oxide semiconductor (NMOS) transistor. The substrate of the first NMOS transistor may be isolated from the substrate of the first semiconductor chip by a deep N-Well (DNW).

Figure 10:
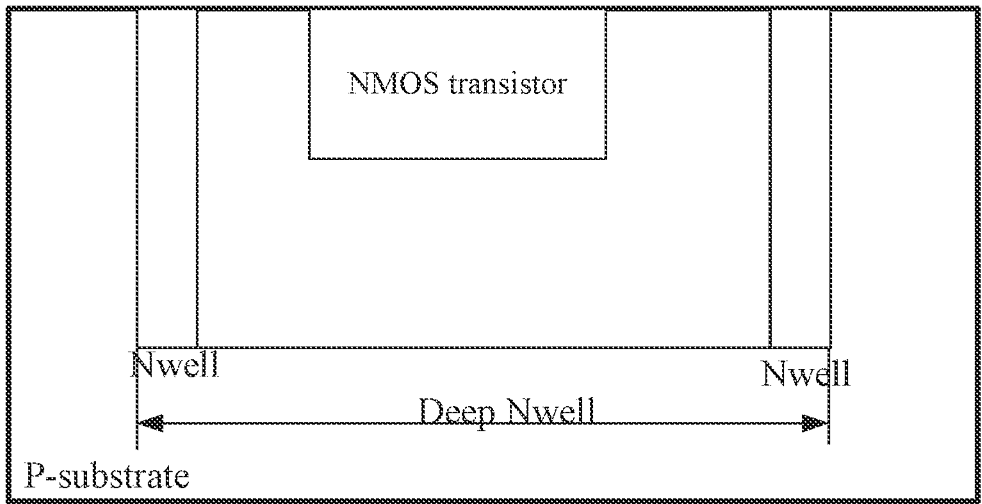
FIG. 10 is a schematic diagram of a location and structure of a first NMOS transistor, according to some aspects of the present disclosure.

For example, as shown in FIG. 10, a schematic diagram of an NMOS transistor disposed at the DNW is provided. In FIG. 10, there are DNWs on the substrate of the first semiconductor chip, and the first NMOS transistor is disposed between adjacent DNWs such that the substrate of the first NMOS transistor and the substrate of the first semiconductor chip are isolated by the DNW, avoiding parasitic P/N junction conduction.

Here, the first sub-circuit has two states: an off state and an on state. Accordingly, a control signal with two different states (e.g., the control signal of the first state and the control signal of the second state) may be used to control the switching of the two states. That is, under the control of the control signal of the first state, the first sub-circuit is in the off state; and under the control of the control signal of the second state, the first sub-circuit is in the on state. For example, the first control signal of the first state may refer to a control signal at a low level such as 0 volt (V). Correspondingly, the first control signal of the second state may refer to a control signal at a high level such as VDD, e.g., 3.3V. Alternatively, the first control signal of the first state may refer to a control signal at a high level. Correspondingly, the first control signal of the second state may refer to a control signal at a low level.

Thus, in the present disclosure, when the first sub-circuit is in the off state, the first semiconductor chip and the second semiconductor chip are disconnected; and when the first sub-circuit is in the on state, the first semiconductor chip and the second semiconductor chip are connected.

Figure 11:
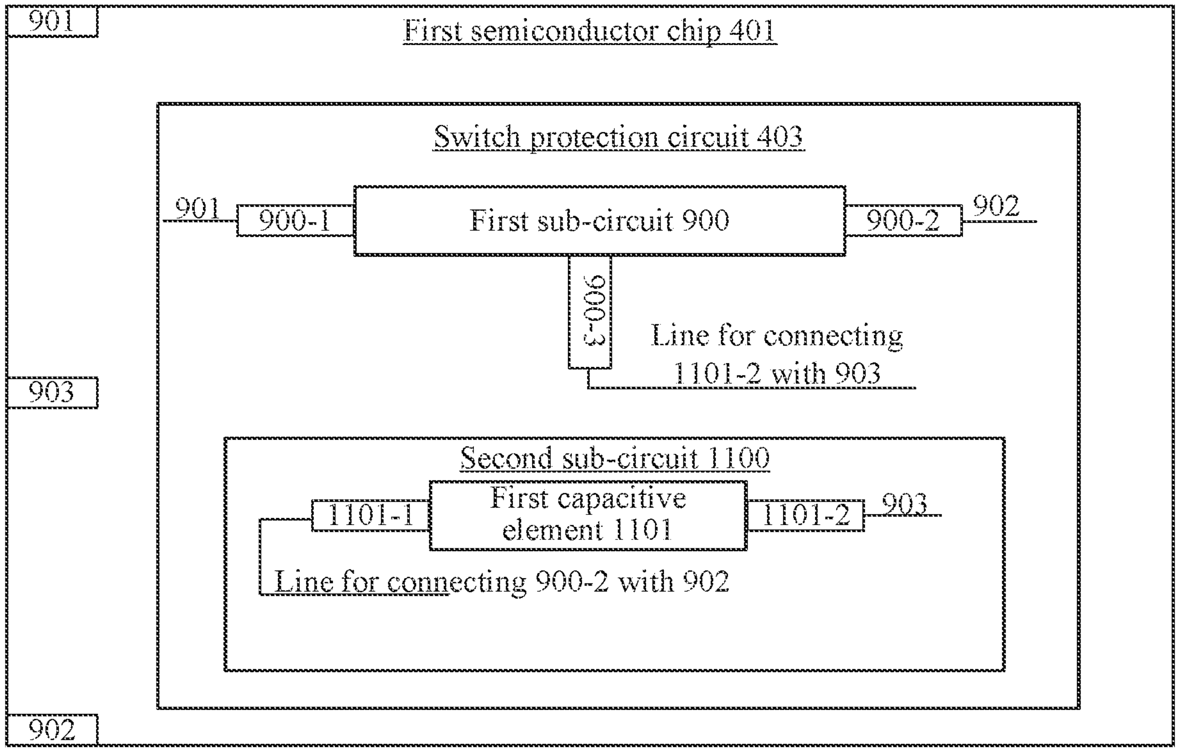
FIGS. 11-22 are some example diagrams of a structure of a semiconductor package, according to some aspects of the present disclosure.

In some implementations, as shown in FIG. 11, the switch protection circuit 403 includes a second sub-circuit 1100. The second sub-circuit 1100 may include a first capacitive element 1101 having a first end 1101-1 connected between the second end 900-2 of the first sub-circuit and the second node 902 in the first semiconductor chip. The second sub-circuit 1100 may include a second end 1101-2 connected with the third node 903 in the first semiconductor chip. The control end 900-3 of the first sub-circuit is connected between the second end 1101-2 of the first capacitive element and the third node 903 in the first semiconductor chip.

It is noted that the control end of the first sub-circuit as described above may be fed with the first control signal. In fact, the first control signal may also be generated by a related circuit. For example, the first capacitive element and the connections thereof are used to form the related circuit to generate the first control signal. For example, the first end of the first capacitive element is connected between the second end of the first sub-circuit and the second node in the first semiconductor chip, and the second end of the first capacitive element is connected with the third node in the first semiconductor chip. At this time, the control end of the first sub-circuit is connected between the second end of the first capacitive element and the third node in the first semiconductor chip, and when the semiconductor package is undergoing a CDM discharge, the third node in the first semiconductor chip is floated, and the control end of the first sub-circuit is fed with the first control signal of the first state via the first capacitive element. When the semiconductor package is in a normal operation, the third node in the first semiconductor chip is fed with the power supply signal, and the control end of the first sub-circuit is fed with the first control signal of the second state via the first capacitive element. Here, the power supply signal may refer to a voltage signal. That is, the third node in the first semiconductor chip is fed with the voltage signal such that the semiconductor package can operate normally.

Figure 12:
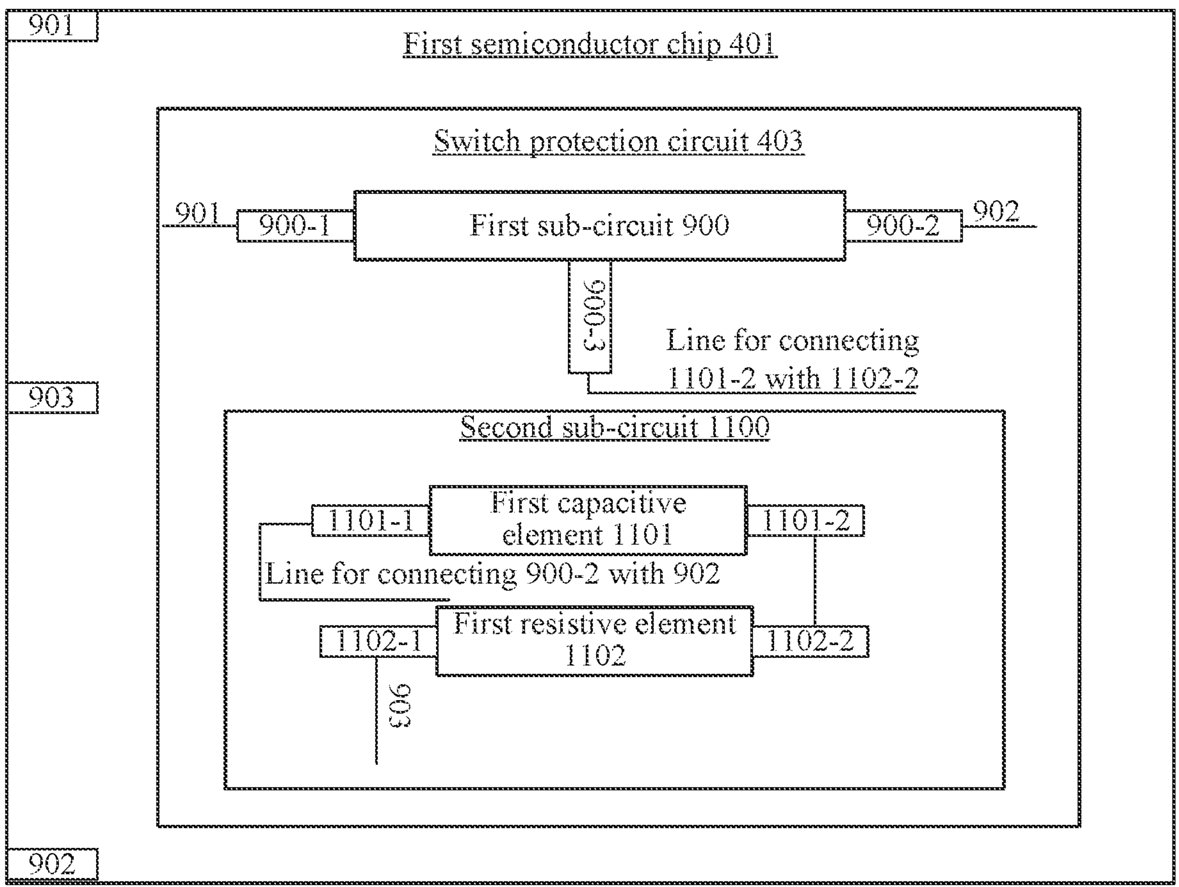

In some other implementations, in order to protect the safety of the first capacitive element, as shown in FIG. 12, the second sub-circuit further includes a first resistive element 1102 having a first end 1102-1 connected with the third node 903 in the first semiconductor chip and a second node 1102-2 connected with the second end 1101-2 of the first capacitive element. The control end 900-3 of the first sub-circuit is connected between the second end of the first capacitive element and the second end of the first resistive element.

It is noted that if a power supply signal may be directly connected across the first capacitive element. Thus, when the voltage of the power supply signal is large, the first capacitive element might be broken down such that the first capacitive element fails, and the control signal cannot be input into the first sub-circuit. Accordingly, to ensure the safety of the first capacitive element, the second sub-circuit may further include a first resistive element to reduce the voltage across the first capacitive element to its acceptable range by a voltage-division or current-limitation. When the second sub-circuit includes the first resistive element, the control end of the first sub-circuit is connected between the second end of the first capacitive element and the second end of the first resistive element; and when the semiconductor package is undergoing a CDM discharge, the third node in the first semiconductor chip is floated, and the control end of the first sub-circuit is fed with the first control signal of the first state via the first capacitive element and the first resistive element. When the semiconductor package is in a normal operation, the third node in the first semiconductor chip is fed with the power supply signal, and the control end of the first sub-circuit is fed with the first control signal of the second state via the first capacitive element and the first resistive element.

In some implementations, the first resistive element may include at least one resistor connected in series, and the first capacitive element may include at least one capacitor connected in series, where the product of the resistance value of the at least one resistor and the capacitance value of the at least one capacitor is in the range of 1 ns-1 μs.

The relationship between the first capacitive element and the first resistive element will now be described. For instance, the product of the capacitance value of the at least one capacitor included in the first capacitive element and the resistance value of the at least one resistor included in the first resistive element is in the range of 1 ns-1 μs. With the above-described conditions being satisfied, the second sub-circuit can cause the first sub-circuit to be fed with the control signal of the first state in time when the semiconductor package is undergoing the CDM discharge, such that the first semiconductor chip and each of the at least one second semiconductor chip are disconnected so as to block static charges carried by the second semiconductor chip to flow into the first semiconductor chip and into the ground via the semiconductor package, which would otherwise cause a breakdown failure of pins of the semiconductor package and the first semiconductor chip. The second sub-circuit can further cause the first sub-circuit to be fed with the control signal of the second state in time when the semiconductor package is the normal operation, such that the first semiconductor chip and the second semiconductor chip are connected, thereby ensuring the normal operation.

Figure 13:
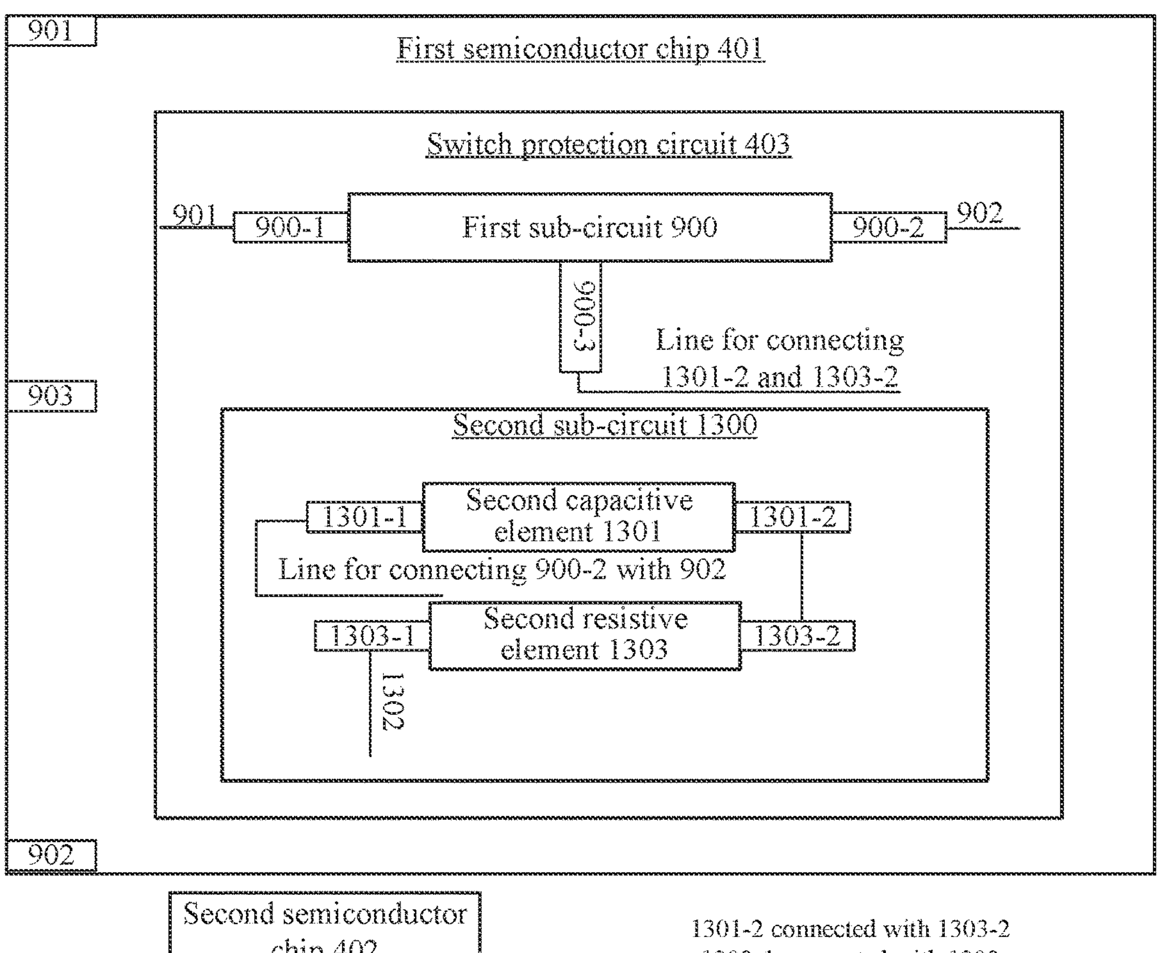

In some other implementations, as shown in FIG. 13, the switch protection circuit 403 may further include a second sub-circuit 1300. The second sub-circuit 1300 includes a second capacitive element 1301 having a first end 1301-1 connected between the second end 900-2 of the first sub-circuit and the second node 902 in the first semiconductor chip and a second end 1301-2 connected with the first node 1302 in a certain second semiconductor chip. The control end 900-3 of the first sub-circuit is connected between the second end 1301-2 of the second capacitive element and the first node 1302 in the certain second semiconductor chip.

It is noted that a structure of one second sub-circuit and connection relationship thereof are described above. FIG. 13 shows another second sub-circuit, and its structure and connection relationship, which may be implemented. Here, the second sub-circuit includes a second capacitive element 1301 having a first end 1301-1 connected in the same manner as the first end of the first capacitive element, e.g., namely connected between the second end of the first sub-circuit and the second node of the first semiconductor chip. However, the connection of the second end 1301-2 of the second capacitive element may be different than that of the second end of the first capacitive element. That is, the second end 1301-2 of the second capacitive element may be connected with a first node 1302 of a certain second semiconductor chip, and the second end of the first capacitive element is connected with a third node 903 of the first semiconductor chip. In case of such a connection relationship, the control end of the first sub-circuit may be connected between the second end of the second capacitive element and the first node in the certain second semiconductor chip; and when the semiconductor package is undergoing a CDM discharge, the first node in the certain second semiconductor chip is floated, and the first sub-circuit is fed with the first control signal of the first state via the second capacitive element. When the semiconductor package is in a normal operation, the first node in a certain second semiconductor chip is fed with the power supply signal, and the first sub-circuit is fed with the first control signal of the second state via the second capacitive element. It is noted that the second end 1301-2 of the second capacitive element here is connected to the first node 1302 of the second semiconductor chip 402 via a pin 1304 of the second semiconductor chip 402.

Here, the first node in the first semiconductor chip may be connected with the grounding pad in the first semiconductor chip, the second node in the first semiconductor chip may be connected with the grounding pin of the first semiconductor chip, and the first node in the certain second semiconductor chip may be connected with the power supply pad in the certain second semiconductor chip.

It is noted that the first node and the second node in the first semiconductor chip are the same as those described above and will not be described any more herein. The first node in the certain semiconductor chip here is connected with the power supply pad in the second semiconductor chip. The advantage of such a configuration is that it is possible to prevent the power supply pad connected with the third node in the first semiconductor chip from interfering with the switch protection circuit, and reduce the power consumption of the power supply pad.

In some implementations, as shown in FIG. 13, the second sub-circuit may further include a second resistive element 1303 having a first end 1303-1 connected with the first node 1302 in the certain second semiconductor chip and a second node 1303-2 connected with the second end 1301-2 of the second capacitive element, and the control end 900-3 of the first sub-circuit is connected between the second end of the second capacitive element and the second end of the second resistive element.

In some implementations, the second resistive element includes at least one resistor connected in series, and the second capacitive element includes at least one capacitor connected in series. The product of the resistance value of the at least one resistor and the capacitance value of the at least one capacitor is in the range of 1 ns-1 μs.

It is noted that the second resistive element here has the same functions as the aforementioned first resistive element and may be understood with reference to the above description, and will not be described any more herein.

The above-described first sub-circuit and the second sub-circuit included in the switch protection circuit are both disposed in the first semiconductor chip. In some other implementations, the switch protection circuit may also be disposed in each second semiconductor chip and may also implement the above-described functions.

Figure 14:
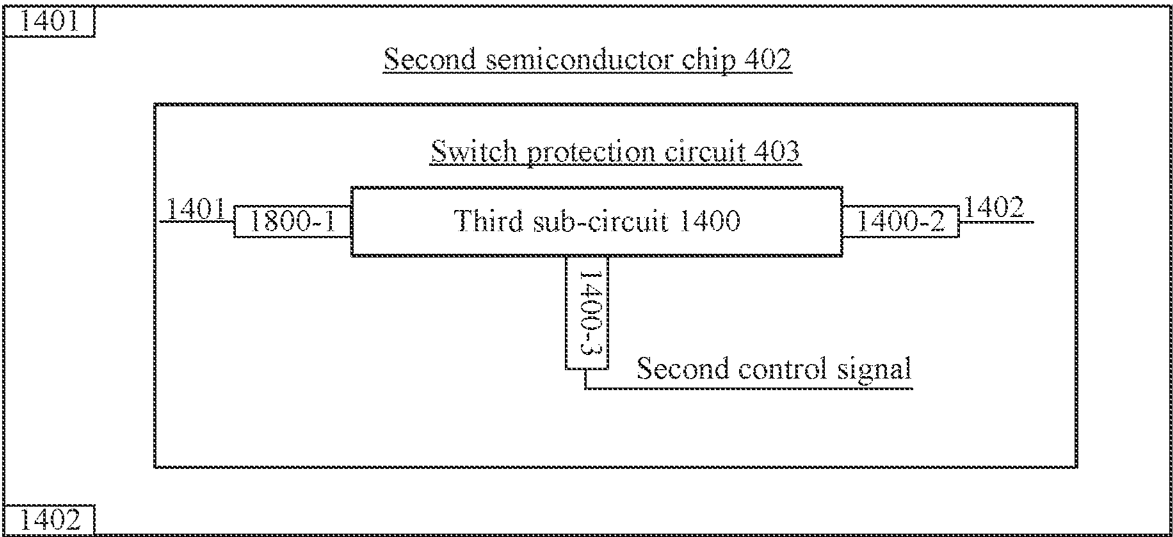

For example, as shown in FIG. 14, the switch protection circuit 403 is disposed in each second semiconductor chip 402 and includes a third sub-circuit 1400. The first end 1400-1 of the third sub-circuit is connected with the second node 1401 in the second semiconductor chip, the second end 1400-2 of the third sub-circuit is connected with the third node 1402 in the second semiconductor chip. The control end 1400-3 of the third sub-circuit is fed with the second control signal, and causes the third sub-circuit to be in the off state when being fed with the second control signal of the first state, or cause the third sub-circuit to be in the on state when being fed with the second control signal of the second state. When the third sub-circuit is in the off state, the first semiconductor chip and the second semiconductor chip are disconnected; and when the third sub-circuit is in on state, the first semiconductor chip and the second semiconductor chip are connected.

Figure 15:
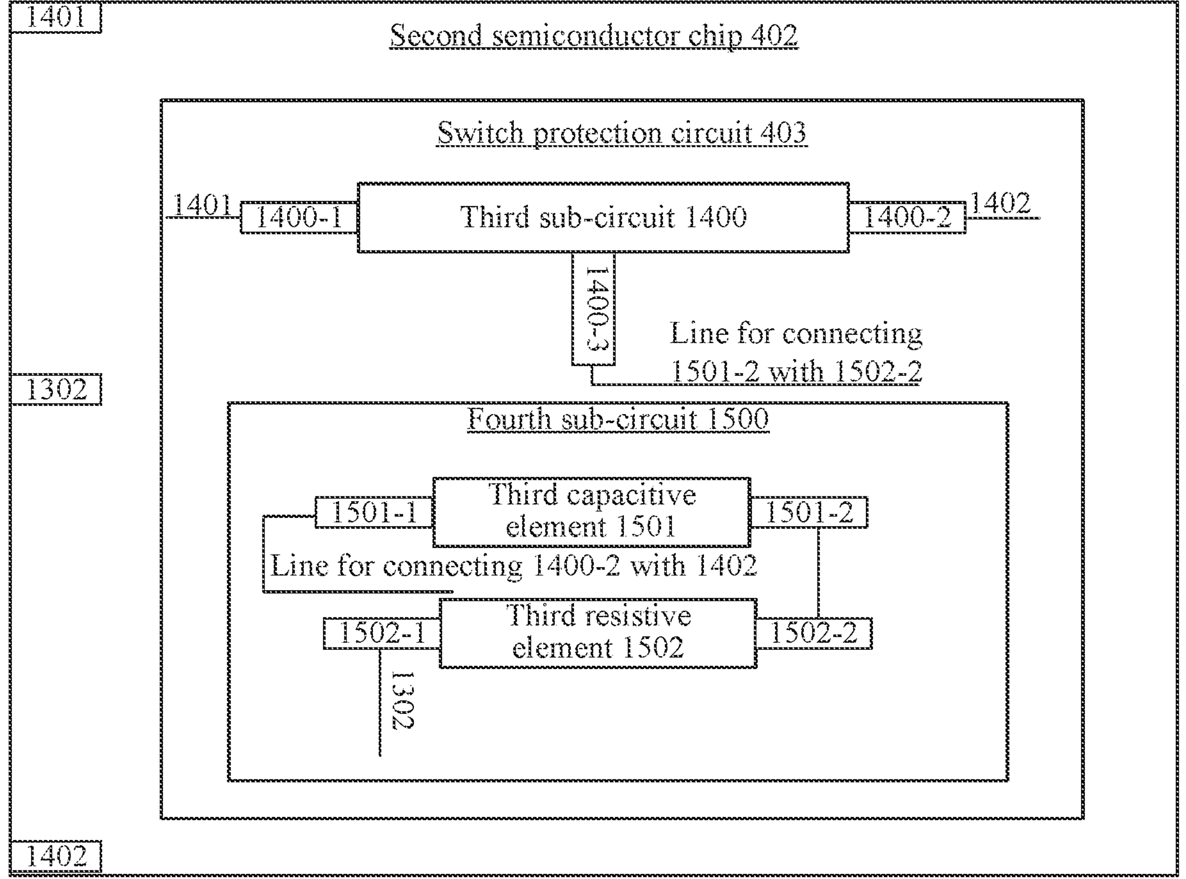

In some implementations, as shown in FIG. 15, the switch protection circuit 403 may further include a fourth sub-circuit 1500. The fourth sub-circuit includes a third capacitive element 1501 having a first end 1501-1 connected between the second end 1400-2 of the third sub-circuit and the third node 1402 in the second semiconductor chip and a second end 1501-2 connected with the first node 1302 in the second semiconductor chip, and the control end 1400-3 of the third sub-circuit is connected between the second end of the third capacitive element and the first node in the second semiconductor chip.

In some implementations, as shown in FIG. 15, the fourth sub-circuit further includes a third resistive element 1502 having a first end 1502-1 connected with the first node in the second semiconductor chip, and a second end 1502-2 connected with the second end of the third capacitive element, and the control end 1400-3 of the third sub-circuit is connected between the second end of the third capacitive element and the second end of the third resistive element.

In some implementations, the third resistive element includes at least one resistor connected in series, and the third capacitive element includes at least one capacitor connected in series. The product of the resistance value of the at least one resistor and the capacitance value of the at least one capacitor is in the range of 1 ns-1 μs.

Figure 16:
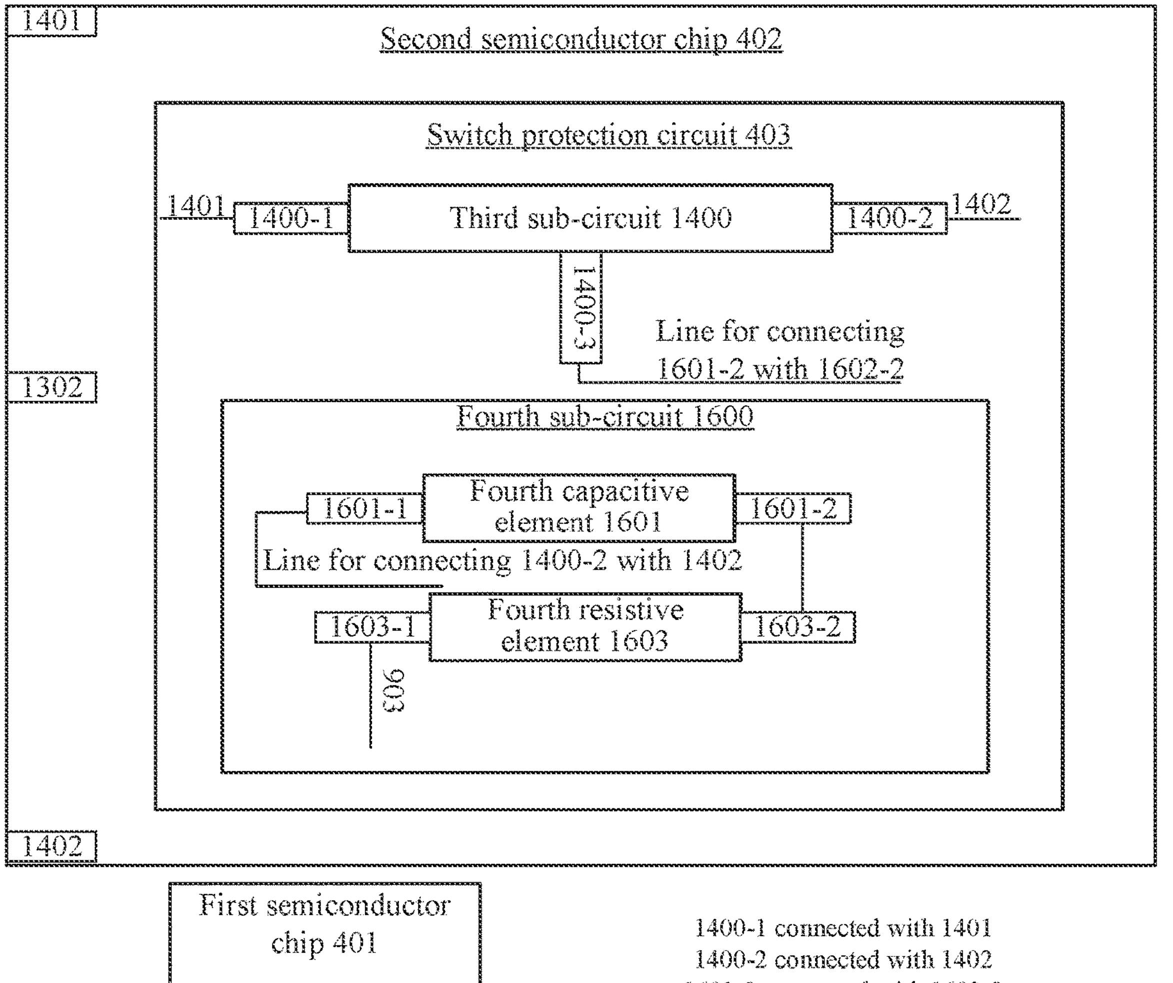

In some other implementations, as shown in FIG. 16, the switch protection circuit 403 further includes a fourth sub-circuit 1600. The fourth sub-circuit includes a fourth capacitive element 1601 having a first end 1601-1 connected between the second end 1400-2 of the third sub-circuit and the third node 1402 in the second semiconductor chip and a second end 1601-2 connected with the third node 903 in the first semiconductor chip, and the control end 1400-3 of the third sub-circuit is connected between the second end of the fourth capacitive element and the third node 903 in the first semiconductor chip.

Here, the second end 1601-2 of the fourth capacitive element is connected to the third node 903 of the first semiconductor chip via a pin 1602 of the first semiconductor chip. This is not shown in FIG. 16. FIG. 16 shows a diagram of an example including the fourth resistive element.

In some implementations, as shown in FIG. 16, the fourth sub-circuit further includes a fourth resistive element 1603 having a first end 1603-1 connected with the third node 903 in the first semiconductor chip and a second end 1603-2 connected with the second end of the fourth capacitive element, and the control end 1400-3 of the third sub-circuit is connected between the second end of the fourth capacitive element and the second end of the fourth resistive element.

Here, the first end 1603-1 of the fourth resistive element is connected to the third node 903 of the first semiconductor chip via a pin 1602 of the first semiconductor chip.

In some implementations, the fourth resistive element includes at least one resistor connected in series, and the fourth capacitive element includes at least one capacitor connected in series, where the product of the resistance value of the at least one resistor and the capacitance value of the at least one capacitor is in the range of 1 ns-1 μs.

In some implementations, the third sub-circuit includes a second N-type metal oxide semiconductor (NMOS) transistor. Here, the substrate of the second NMOS transistor is isolated from the substrate of the second semiconductor chip by a deep N-Well (DNW). It is noted that the isolation principle of the DNW has been described above and will not be described any more herein.

It is noted that the structure and connection of the switch protection circuit described with respect to FIGS. 14 to 16 are different from those of the switch protection circuit as described above with respect to FIGS. 4 to 13 because the switch protection circuits are disposed in different semiconductor chips. However, the operation principles of the switch protection circuits and functions of elements in the switch protection circuits may be similar. Functions of elements in the switch protection circuit shown in FIGS. 14 to 16 are similar to that of elements in the switch protection circuit shown in FIGS. 4 to 13, which have been described in detail above, and will not be described any more herein.

Figure 17:
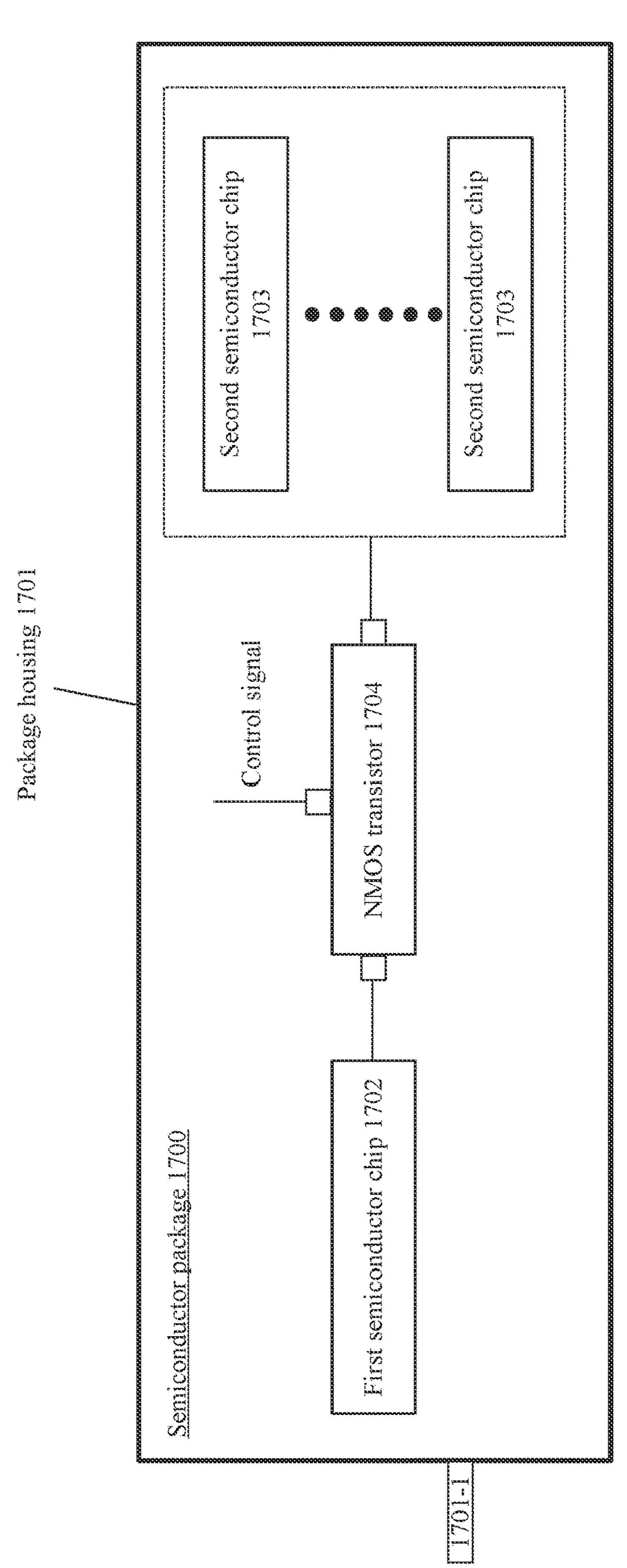

As shown in FIG. 17, another semiconductor package 1700 is depicted. Semiconductor package 1700 may include a package housing 1701 provided with a first pin 1701-1 that allows a charged device model (CDM) discharge, a first semiconductor chip 1702 in the package housing, and at least one second semiconductor chip 1703 in the package housing, each being connected with the first semiconductor chip via a N-type metal oxide semiconductor (NMOS) transistor 1704. The NMOS transistor is disposed in the first semiconductor chip or in each of the at least one second semiconductor chip, the control end of the NMOS transistor is fed with a control signal, and the state of the control signal is controlled by whether the first pin is undergoing the charged device model (CDM) discharge.

Here, the first pin of the semiconductor package may include an input pin or an output pin, namely, the signal pin of the semiconductor package shown in the above FIGS. 7 to 9.

Figure 18:
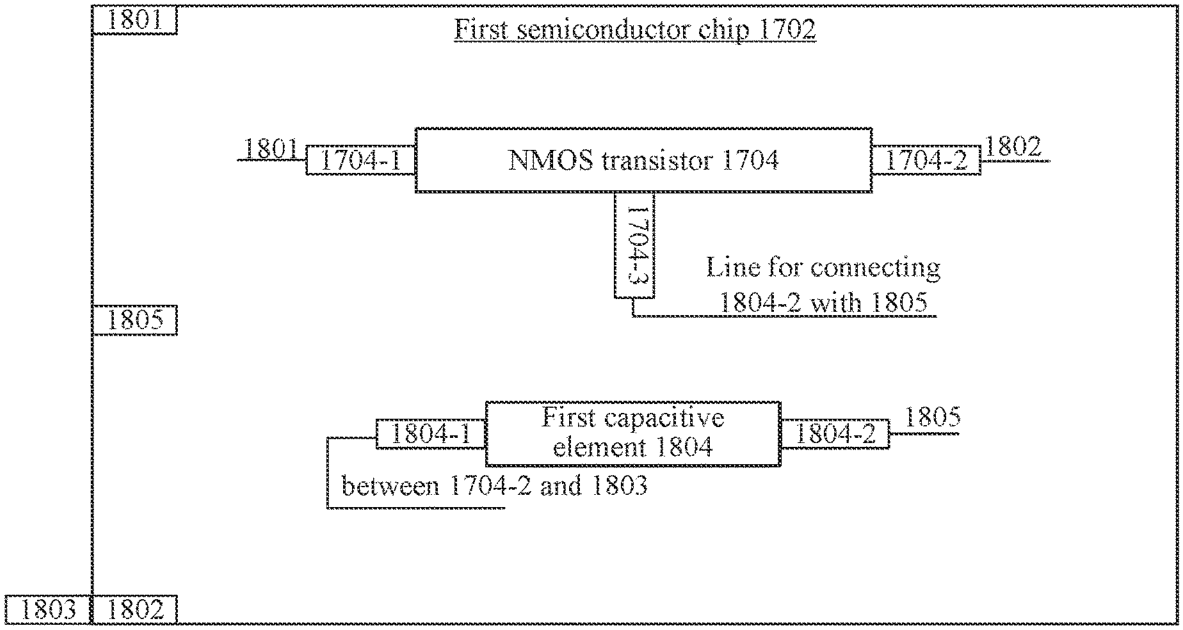

In some implementations, as shown in FIG. 18, the NMOS transistor is disposed in the first semiconductor chip. The first end 1704-1 of the NMOS transistor is connected with the first node 1801 in the first semiconductor chip. The second end 1704-2 of the NMOS transistor is connected with the second node 1802 in the first semiconductor chip. The control end 1704-3 of the NMOS transistor is fed with the control signal. The second node 1802 in the first semiconductor chip is connected with the first pin 1803 of the first semiconductor chip. The first semiconductor chip is further connected with each of the at least one second semiconductor chip via the first pin of the first semiconductor chip.

In some implementations, as shown in FIG. 18, the first semiconductor chip is further provided with a first capacitive element 1804 having a first end 1804-1 connected between the second end of the NMOS transistor and the first pin 1803 of the first semiconductor chip and a second end 2403-2 connected with the third node 1805 in the first semiconductor chip. The control end 1704-3 of the NMOS transistor is connected between the second end of the first capacitive element and the third node in the first semiconductor chip. When the first pin of the semiconductor package is undergoing the CDM discharge, the third node in the first semiconductor chip is floated, and the control end of the NMOS transistor is fed with the control signal of the first state via the first capacitive element. When the first pin of the semiconductor package is in a normal operation, the third node in the first semiconductor chip is fed with the power supply signal, and the control end of the NMOS transistor is fed with the control signal of the second state via the first capacitive element.

Here, the first pin 1803 is connected with the second node 1802 in the first semiconductor chip. The first end of the first capacitive element 1804 is connected between the second end 1704-2 of the NMOS transistor and the first pin 1803 of the first semiconductor chip, which connection may be at the second node 1802, or at any place between the second end 1704-2 and the first pin 1803 so long as the connection may be allowed at the place. The connection between an external pin and an internal node in other drawings should be understood similarly and will not be further described.

Figure 19:
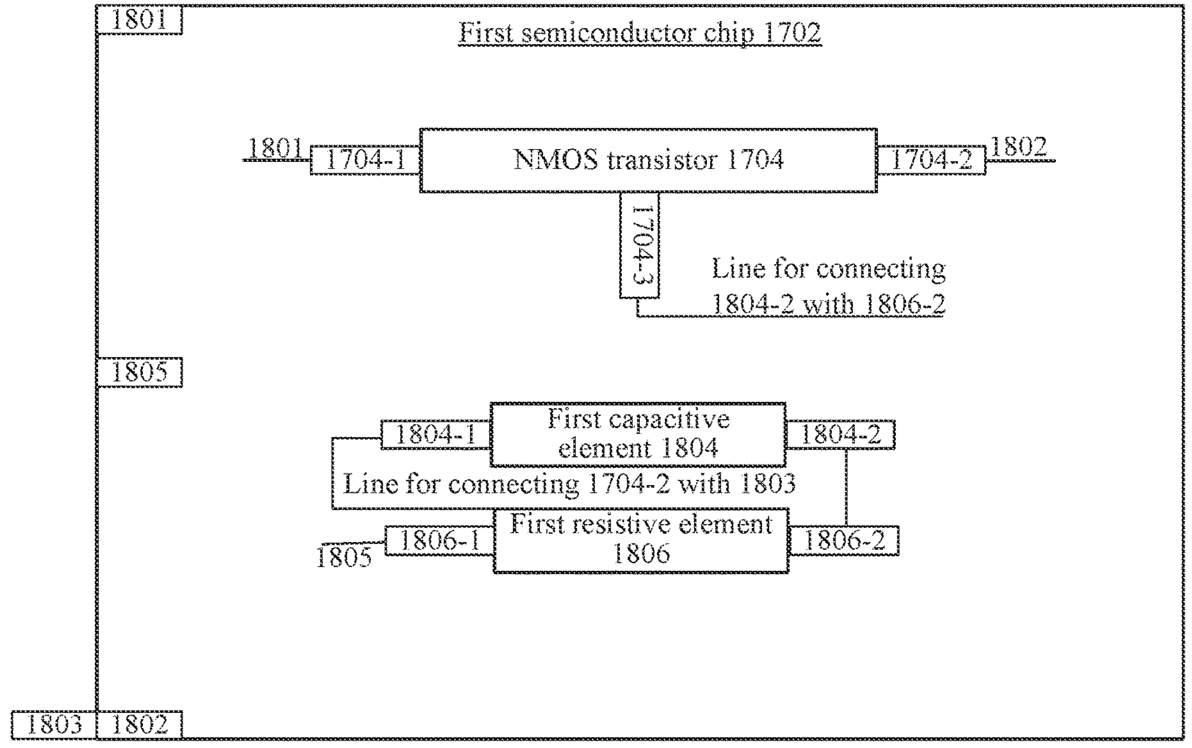

In some implementations, as shown in FIG. 19, the first semiconductor chip is further provided with a first resistive element 1806. A first end 1806-1 of the first resistive element is connected with the third node 1805 in the first semiconductor chip, a second end 1806-2 of the first resistive element is connected with the second end of the first capacitive element, and a control end 1704-3 of the NMOS transistor is connected between the second end of the first capacitive element and the second end of the first resistive element.

Figure 20:
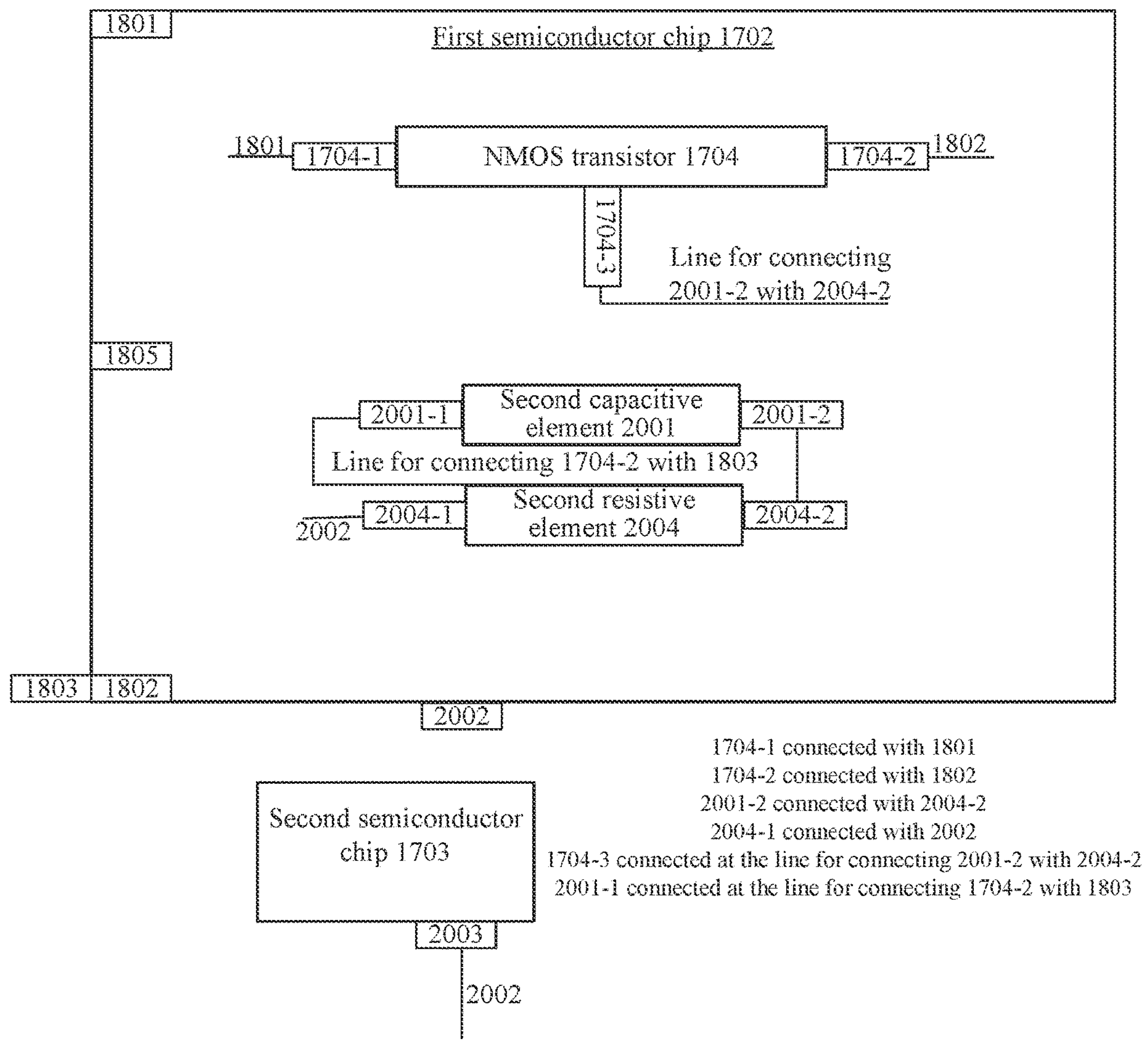

In some implementations, as shown in FIG. 20, the first semiconductor chip is further provided with a second capacitive element 2001 having a first end 2001-1 connected between the second end of the NMOS transistor and the first pin of the first semiconductor chip and a second end 2001-2 connected with the first pin 2003 of the second semiconductor chip via a second pin 2002 of the first semiconductor chip, and the control end 1704 of the NMOS transistor is connected between the second end of the second capacitive element and the first pin 2003 of the second semiconductor chip. When the first pin of the semiconductor package is undergoing the CDM discharge, the first pin of the second semiconductor chip is floated, and the control end of the NMOS transistor is fed with the control signal of the first state via the second capacitive element. When the first pin of the semiconductor package is in a normal operation, the first pin of the second semiconductor chip is fed with the power supply signal, and the control end of the NMOS transistor is fed with the control signal of the second state via the second capacitive element.

In some implementations, as shown in FIG. 20, the first semiconductor chip is further provided with a second resistive element 2004. A first end 2004-1 of the second resistive element is connected with the first pin 2003 of the second semiconductor chip via the second pin 2002 of the first semiconductor chip, a second end 2004-2 of the second resistive element is connected with the second end 2001-2 of the second capacitive element, and a control end 1704-3 of the NMOS transistor is connected between the second end of the second capacitive element and the second end of the second resistive element.

In some implementations, the first pin 1803 of the first semiconductor chip includes a grounding pin; and the second pin 2002 of the first semiconductor chip and the first pin 2003 of the second semiconductor chip include a power supply pin.

Figure 21:
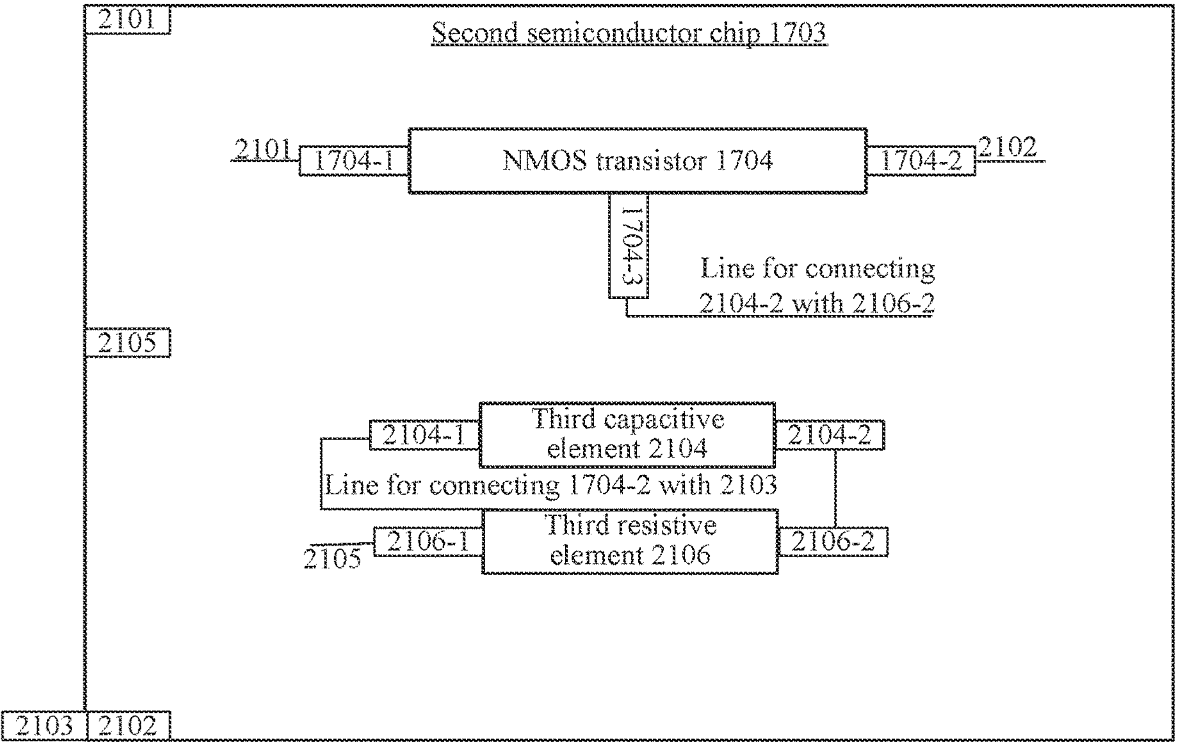

In some implementations, as shown in FIG. 21, the NMOS transistor is disposed in each second semiconductor chip. In a certain second semiconductor chip, the first end 1704-1 of the NMOS transistor is connected with the second node 2101 in the second semiconductor chip, the second end 1704-2 of the NMOS transistor is connected with the third node 2102 in the second semiconductor chip, and the control end 1704-3 of the NMOS transistor is fed with the control signal. The third node 2102 in the second semiconductor chip is connected with the second pin 2103 of the second semiconductor chip, and the second semiconductor chip is further connected with the first semiconductor chip via the second pin 2103 of the second semiconductor chip.

In some implementations, as shown in FIG. 21, the second semiconductor chip is provided with a third capacitive element 2104 having a first end 2104-1 connected between the second end of the NMOS transistor and the second pin 2103 of the second semiconductor chip and a second end 2104-2 connected with the first node 2105 in the second semiconductor chip. The control end 1704-3 of the NMOS transistor is connected between the second end of the third capacitive element and the first node 2105 in the second semiconductor chip. When the first pin of the semiconductor package is undergoing a CDM discharge, the first node in the second semiconductor chip is floated. The control end of the NMOS transistor is fed with the control signal of the first state via the third capacitive element. When the first pin of the semiconductor package is in a normal operation, the first node in the second semiconductor chip is fed with the power supply signal, and the control end of the NMOS transistor is fed with the control signal of the second state via the third capacitive element.

In some implementations, as shown in FIG. 21, the second semiconductor chip is further provided with a third resistive element 2106. A first end 2106-1 of the third resistive element is connected with the first node 2105 in the second semiconductor chip, and a second end 2106-2 of the third resistive element is connected with the second end 2104-1 of the third capacitive element. The control end 1704-3 of the NMOS transistor is connected between the second end of the third resistive element and the second end of the third capacitive element.

Figure 22:
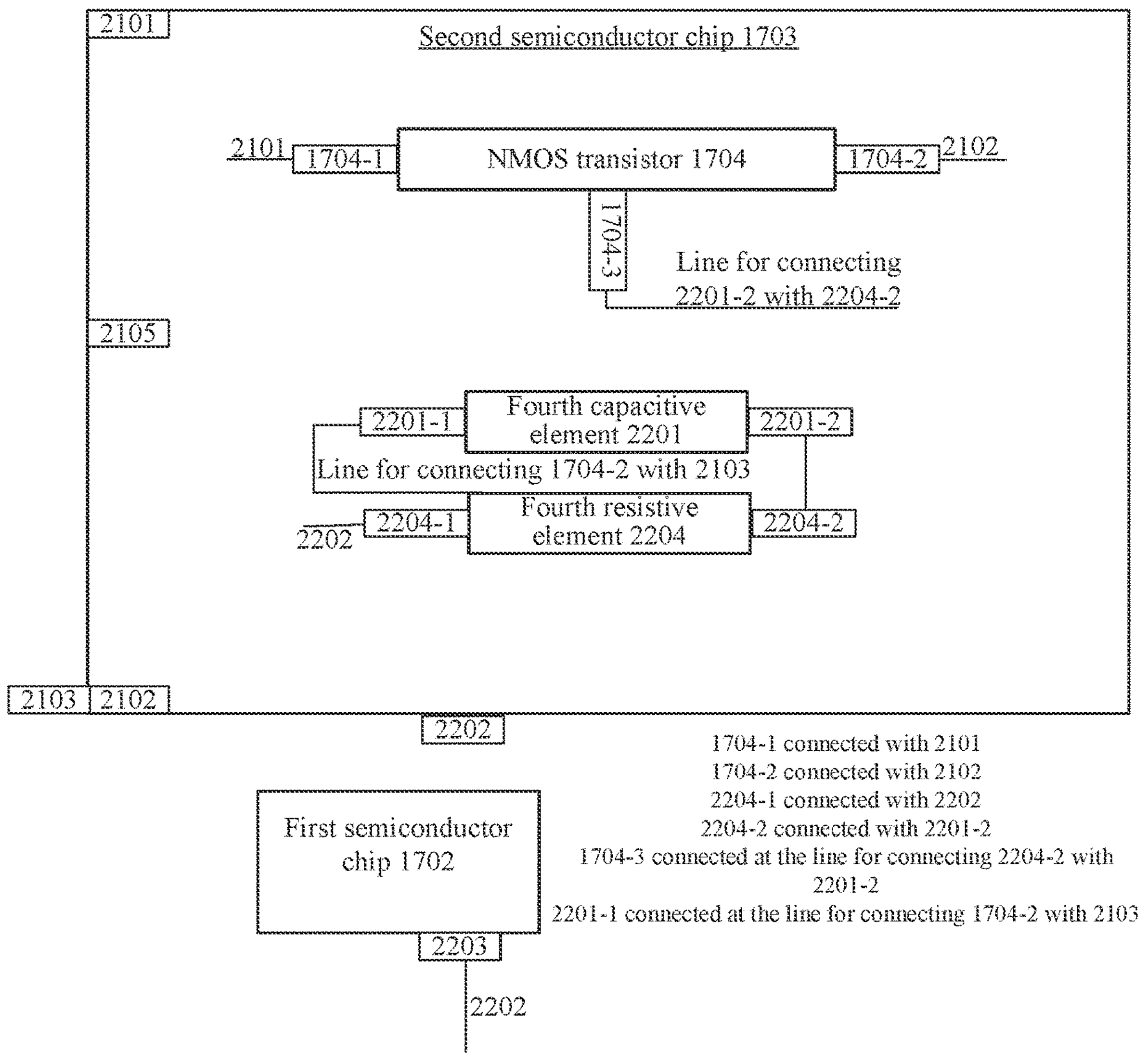

In some implementations, as shown in FIG. 22, the second semiconductor chip is further provided with a fourth capacitive element 2201 having a first end 2201-1 connected between the second end 1704-2 of the NMOS transistor and the second pin 2103 of the second semiconductor chip and a second end 2202-2 connected with the third pin 2203 of the first semiconductor chip via a third pin 2202 of the second semiconductor chip. When the first pin of the semiconductor package is undergoing a CDM discharge, the third pin of the first semiconductor chip is floated, and the control end of the NMOS transistor is fed with the control signal of the first state via the third capacitive element. When the first pin of the semiconductor package is in a normal operation, the third pin of the first semiconductor chip is fed with the power supply signal, and the control end of the NMOS transistor is fed with the control signal of the second state via the third capacitive element.

In some implementations, the second semiconductor chip is further provided with a fourth resistive element 2204. A first end 2204-1 of the fourth resistive element is connected with the third pin 2203 of the first semiconductor chip via the third pin 2202 of the second semiconductor chip, a second end 2204-2 of the fourth resistive element is connected with the second end 2201-2 of the fourth capacitive element, and the control end of the NMOS transistor is connected between the second end of the fourth resistive element and the second end of the fourth capacitive element.

In some implementations, the second pin 2103 of the second semiconductor chip includes a grounding pin; and the third pin 2202 of the first semiconductor chip and the third pin 2203 of the first semiconductor chip include a power supply pin.

In some implementations, the first semiconductor chip may be an interface chip and the second semiconductor chip may be a NAND flash chip.

Figure 23:
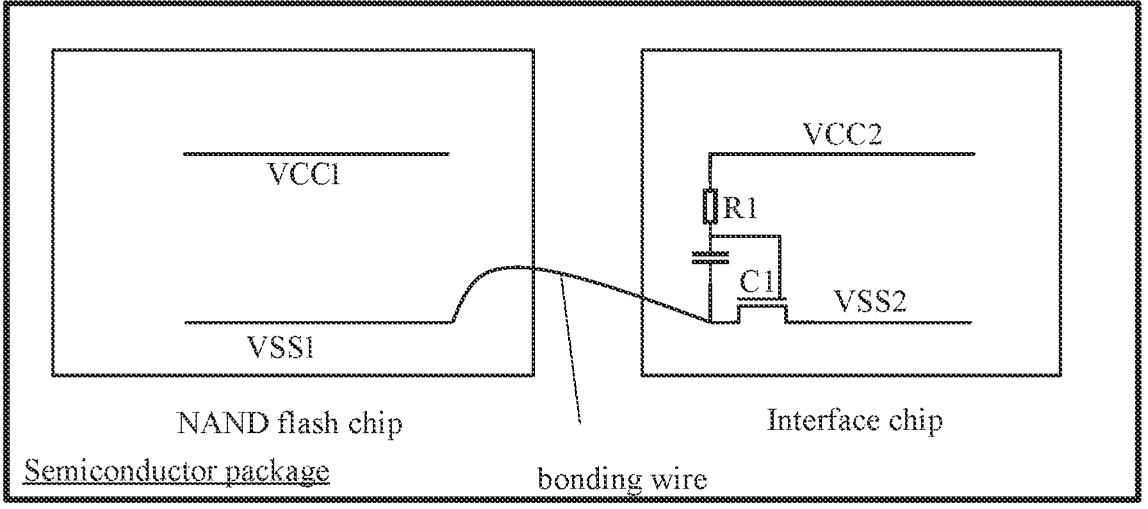
FIG. 23 is a schematic diagram of an example structure of the semiconductor package shown in FIG. 12, according to some aspects of the present disclosure.

In order to facilitate understanding the above-described semiconductor package, a schematic diagram of an example structure of the semiconductor package shown in FIG. 12, according to some aspects shown in FIG. 23.

In FIG. 23, the structure of the semiconductor package is simplified, and the present disclosure is illustrated with respect to only an example in which the semiconductor package includes one NAND chip and one interface chip. Here, the switch protection circuit is disposed in the interface chip, and the NMOS transistor included in the switch protection circuit has a first end connected with the grounding pad VSS2 in the interface chip, a second end connected with the grounding pin of the interface chip, and a control end connected between the resistor R1 and capacitor C1 connected in series. Furthermore, the grounding pin of the NAND chip and the grounding pin of the interface chip are connected via a bonging wire. VCC1 in FIG. 23 is a sub-power supply pin or sub-power supply pad of the NAND chip; and VCC2 is a power supply pin or power supply pad of the interface chip and may be connected with the third node in the aforementioned first semiconductor chip. In this structure, if a signal pin of the semiconductor package is subjected to a CDM discharge, VCC1 and VCC2 are floated, and the control end of the NMOS transistor is pulled down to a low potential of VSS1 by C1. Therefore, the NMOS transistor is in off state and VSS1 and VSS2 are electrically disconnected, so that static charges in the NAND chip will not flow to the interface chip. Accordingly, the interface chip only accomplishes its own CDM discharge and does not need to handle a large amount of CDM charges from the NAND chip, thereby avoiding a CDM breakdown failure of a pin of the interface chip. When the semiconductor package is in a normal operation, VCC2 is at a high potential, and the control end (a gate) of the NMOS transistor is pulled up to a high potential of VCC2 by R1. Therefore, the second NMOS transistor maintains the conduction state, the VSS1 and VSS2 are eclectically connected without any influence on the normal operation of the overall Combo-NAND.

Figure 24:
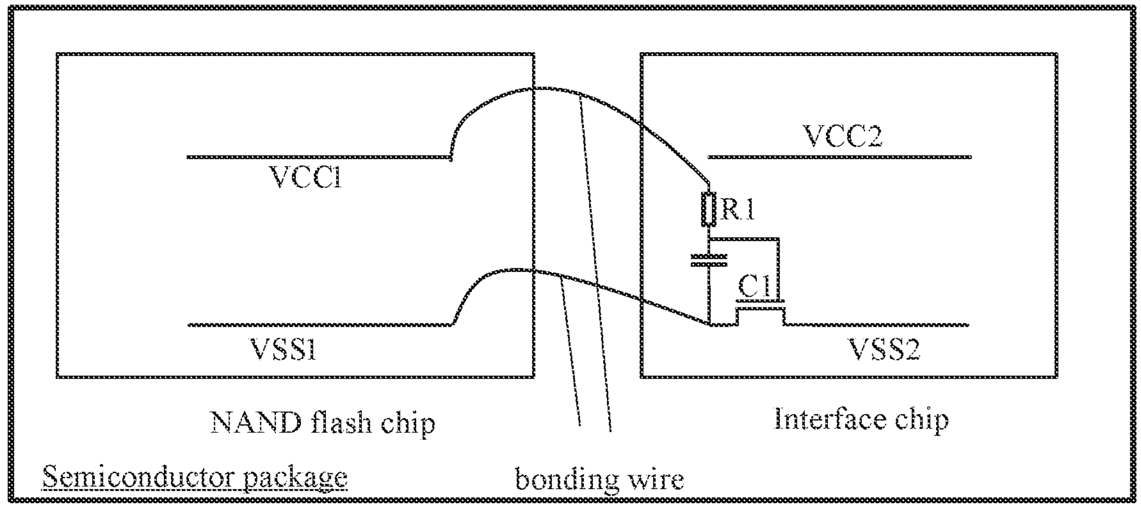
FIG. 24 is a schematic diagram of another example structure of the semiconductor package shown in FIG. 13, according to some aspects of the present disclosure.

In some other implementations, as shown in FIG. 24, another example structure diagram of the semiconductor package shown in FIG. 13 as provided according to some aspects of the present disclosure is shown. FIG. 23 is different from FIG. 24 in that resistor R1 is connected with VCC1. That is, when the semiconductor package is in a normal operation, the control end (a gate) of the NMOS transistor is pulled up to a high potential of VCC1 by R1. Accordingly, the NMOS transistor maintains the conduction state, and VSS1 and VSS2 are electrically connected without any influence on the normal operation of the overall Combo-NAND.

In a semiconductor package provided in implementations of the present disclosure, a CDM discharge switch protection circuit such as a NMOS circuit is disposed at the VSS2 bus of the interface chip to control the connection of VSS1 of the NAND chip with VSS2 of the interface chip and the disconnection of VSS1 of the NAND chip from VSS2 of the interface chip. When a CDM discharge is performed, under a transient condition, a gate of the switch NMOS is pulled to the potential of VSS1 by C1 and the switch NMOS is turned off, thereby disconnecting VSS1 from VSS2 to cut the path along which CDM charges of the NAND chip flow to the interface chip. This may avoid the static electricity failure of the signal pin of the interface chip caused by a large amount of static charges in the NADN chip. When the chip is in a normal operation, the gate of the switch NMOS is pulled up to VCC2 by R1 and the NMOS is completely turned on to connect VSS1 with VSS2. Further, the NMOS may be disposed in the DNW in the substrate of the interface chip such that the substrate of NMOS and the substrate of interface chip are isolated by the DNW, thereby avoiding the connection between VSS1 and VSS2 by a parasitic P/N junction. The resistor R1 of the switch circuit may also be connected to VCC1 via a bonding wire to avoid VCC2's interference with the switch circuit, reduce the power consumption of VCC2 and implement the same functions.

It is noted that in the semiconductor package provided in implementations of the present disclosure, it is also possible to dispose the switch protection circuit in the memory chip such as the NAND flash chip. Based on this, the connection of the switch protection circuit in the memory chip is somewhat different, but the function and structure of the switch protection circuit are the same as the aforementioned switch protection circuit, and thus may be understood by referring to the above description and will not be described any more herein. By disposing the switch protection circuit in the memory chip, it is possible to avoid the interface chip's interference with the switch circuit, reduce the power consumption of the interface chip, reduce the area of the interface chip, and implement the same functions. However, it is necessary to integrate the switch circuit in each NAND chip and cut CDM currents in all NAND chips.

It is noted that in the implementations provided in the present disclosure, it should be understood that the disclosed device and method may be implemented in other ways. The device examples described above are only illustrative. For example, the division of units is only a logical functional division and there may be additional division manners in practical implementations. For example, a plurality of units or components may be combined or integrated into another system, or some features may be omitted or not executed. Additionally, the coupling or directly coupling or communication connection between the illustrated or discussed components may be indirect coupling or communication connection via some interfaces, devices or units, and may be in electric, mechanical or other forms.

The units illustrated as separate components above may or may not be physically separated. The components illustrated as units may or may not be physical units. That is, they may be located at one place or distributed among many network units, and some or all units of them may be selected according to practical requirements to realize objects of the solution according to the present implementations.

Moreover, functional units in implementations of the present disclosure may all be integrated in one processing unit, or the units may be separate individual units, or two or more units may be integrated in one unit. The above-described integrated unit may be implemented in the form of hardware or in form of hardware plus software functional units.

Those of ordinary skill in the art may appreciate that all or part of the operations for implementing the above-described method implementations may be accomplished by hardware related to program instructions. The program may be stored in a computer readable memory medium and, when being executed, may execute the operations included in the aforementioned method implementations. The aforementioned memory medium includes various media that can store program codes such as a mobile memory device, a read-only memory (ROM), a random access memory (RAM), a disk, an optical disk, etc.

Alternatively, when the integrated unit as described above is implemented in form of software functional modules and sold or used as a separate product, it may be stored in one computer readable memory medium. Based on such understanding, the technical solution in implementations of the present disclosure may be essentially embodied in the form of a software product, or parts thereof that contribute to the prior art may be embodied in the form of a software product, where the computer software product is stored in a memory medium and includes several instructions to enable a computer device such as a personal computer, a server, or a network device to execute all or parts of the method described in implementations of the present disclosure. The aforementioned memory medium includes various media that can store program codes such as a mobile memory device, a ROM, a RAM, a disk, an optical disk, etc.

What has been described above are only specific implementations of the present disclosure. However, the scope of the present disclosure is not limited thereto, and variations or substitutions that easily occur to those skilled in the art in light of the technical contents disclosed by the present disclosure will fall within the scope of the present disclosure. Therefore, the scope of the present disclosure should be determined by the scope of the claims.

What is claimed is:

1. A semiconductor package, comprising:

a first semiconductor chip;

at least one second semiconductor chip; and a switch protection circuit having a first end connected with the first semiconductor chip, a second end connected with each of the at least one second semiconductor chip, and a control end configured to receive a control signal for controlling the switch protection circuit to be in an off state or an on state, wherein:

a state of the control signal is determined based on whether a pin of the semiconductor package is undergoing a charged device model (CDM) discharge, the control signal comprises a first state indicating a CDM discharge at the pin and a second state indicating a normal operation of the semiconductor package; and when the switch protection circuit is fed with the control signal of the first state indicative of a CDM discharge, the switch protection circuit is in an off state to disconnect the first semiconductor chip and the at least one second semiconductor chip.

2. The semiconductor package of claim 1, wherein when the switch protection circuit is fed with the control signal of the second state indicating that the semiconductor package is in a normal operation, the switch protection circuit is in an on state to connect the first semiconductor chip and the at least one second semiconductor chip.

3. The semiconductor package of claim 1, wherein:

the switch protection circuit is disposed in the first semiconductor chip and comprises a first sub-circuit, a first end of the first sub-circuit is connected with a first node in the first semiconductor chip, a second end of the first sub-circuit is connected with a second node in the first semiconductor chip, a control end of the first sub-circuit is fed with a first control signal, the control end of the first sub-circuit being the control end of the switch protection circuit, and the first control signal being the control signal, the first sub-circuit is in an off state when being fed with the first control signal of a first state, or the first sub-circuit is in an on state when being fed with the first control signal of a second state, when the first sub-circuit is in the off state, the first semiconductor chip and the at least one second semiconductor chip are disconnected, and when the first sub-circuit is in the on state, the first semiconductor chip and the at least one second semiconductor chip are connected.

4. The semiconductor package of claim 3, wherein:

the switch protection circuit further comprises a second sub-circuit, the second sub-circuit comprises a first capacitive element having a first end connected between the second end of the first sub-circuit and the second node in the first semiconductor chip and a second end connected with a third node in the first semiconductor chip, and the control end of the first sub-circuit is connected between the second end of the first capacitive element and the third node.

5. The semiconductor package of claim 3, wherein:

the switch protection circuit further comprises a second sub-circuit, the second sub-circuit comprises a second capacitive element having a first end connected between the second end of the first sub-circuit and the second node in the first semiconductor chip and a second end connected with a first node in a second semiconductor chip of the at least one second semiconductor chip, and the control end of the first sub-circuit is connected between the second end of the second capacitive element and the first node in the second semiconductor chip.

6. The semiconductor package of claim 4, wherein:

the second sub-circuit further comprises a first resistive element having a first end connected with the third node in the first semiconductor chip and a second end connected with the second end of the first capacitive element, and the control end of the first sub-circuit is connected between the second end of the first capacitive element and the second end of the first resistive element.

7. The semiconductor package of claim 5, wherein:

the second sub-circuit further comprises a second resistive element having a first end connected with the first node in the second semiconductor chip and a second end connected with the second end of the second capacitive element, and the control end of the first sub-circuit is connected between the second end of the second capacitive element and the second end of the second resistive element.

8. The semiconductor package of claim 3, wherein the first sub-circuit comprises a first N-type metal oxide semiconductor (NMOS) transistor.

9. The semiconductor package of claim 6, wherein:

the first resistive element comprises at least one resistor connected in series, the first capacitive element comprises at least one capacitor connected in series, and a product of a resistance value of the at least one resistor and a capacitance value of the at least one capacitor is in a range of 1 ns-1 μs.

10. The semiconductor package of claim 7, wherein:

the second resistive element comprises at least one resistor connected in series, the second capacitive element comprises at least one capacitor connected in series, and a product of a resistance value of the at least one resistor and a capacitance value of the at least one capacitor is in a range of 1 ns-1 μs.

11. The semiconductor package of claim 6, wherein:

the first node in the first semiconductor chip is connected with a grounding pad in the first semiconductor chip, the second node in the first semiconductor chip is connected with a grounding pin of the first semiconductor chip, and the third node in the first semiconductor chip is connected with a power supply pad in the first semiconductor chip.

12. The semiconductor package of claim 7, wherein:

the first node in the first semiconductor chip is connected with a grounding pad in the first semiconductor chip, the second node in the first semiconductor chip is connected with a grounding pin of the first semiconductor chip, and the first node in the second semiconductor chip is connected with a power supply pad in the second semiconductor chip.

13. The semiconductor package of claim 1, wherein:

the switch protection circuit is disposed in each of the at least one second semiconductor chip and comprises a third sub-circuit, a first end of the third sub-circuit is connected with a second node in the at least one second semiconductor chip, a second end of the third sub-circuit is connected with a third node in the at least one second semiconductor chip, a control end of the third sub-circuit is fed with a second control signal, the control end of the third sub-circuit being the control end of the switch protection circuit, and the second control signal being the control signal, the third sub-circuit is in an off state when being fed with the second control signal of a first state, or the third sub-circuit is in an on state when being fed with the second control signal of a second state, when the third sub-circuit is in an off state, the first semiconductor chip and the at least one second semiconductor chip are disconnected, and when the third sub-circuit is in an on state, the first semiconductor chip and the at least one second semiconductor chip are connected.

14. The semiconductor package of claim 13, wherein:

the switch protection circuit further comprises a fourth sub-circuit, the fourth sub-circuit comprises a third capacitive element having a first end connected between the second end of the third sub-circuit and the third node in the at least one second semiconductor chip and a second end connected with a first node in the at least one second semiconductor chip, and the control end of the third sub-circuit is connected between the second end of the third capacitive element and the first node in the at least one second semiconductor chip.

15. The semiconductor package of claim 13, wherein:

the switch protection circuit further comprises a fourth sub-circuit, the fourth sub-circuit comprises a fourth capacitive element having a first end connected between the second end of the third sub-circuit and the third node in the at least one second semiconductor chip and a second end connected with a third node in the first semiconductor chip, and the control end of the third sub-circuit is connected between the second end of the fourth capacitive element and the third node in the first semiconductor chip.

16. The semiconductor package of claim 14, wherein:

the fourth sub-circuit further comprises a third resistive element having a first end connected with the first node in the at least one second semiconductor chip and a second end connected with the second end of the third capacitive element, and the control end of the third sub-circuit is connected between the second end of the third capacitive element and the second end of the third resistive element.

17. The semiconductor package of claim 15, wherein:

the fourth sub-circuit further comprises a fourth resistive element having a first end connected with the third node in the first semiconductor chip and a second end connected with the second end of the fourth capacitive element, and the control end of the third sub-circuit is connected between the second end of the fourth capacitive element and the second end of the fourth resistive element.

18. The semiconductor package of claim 13, wherein the third sub-circuit comprises a second N-type metal oxide semiconductor (NMOS) transistor.

19. A semiconductor package, comprising:

a package housing provided with a first pin that is susceptible to a charged device model (CDM) discharge;

a first semiconductor chip in the package housing; and at least one second semiconductor chip in the package housing, each being connected with the first semiconductor chip via a N-type metal oxide semiconductor (NMOS) transistor, wherein the NMOS transistor is disposed in the first semiconductor chip or in each of the at least one second semiconductor chip, wherein a control end of the NMOS transistor is fed with a control signal for controlling the NMOS transistor to be in an off state or an on state, wherein a state of the control signal is determined based on whether the first pin is undergoing the CDM discharge, wherein the semiconductor package further comprises a capacitive element having a first end connected with a second end of the NMOS transistor, and a second end connected with a node of one of the first semiconductor chip and the at least one second semiconductor chip, and wherein the control end of the NMOS transistor is connected between the second end of the capacitive element and the node.

20. An integrated circuit (IC) chip, comprising:

a semiconductor package, comprising:

a first semiconductor chip;

at least one second semiconductor chip; and a switch protection circuit having a first end connected with the first semiconductor chip, a second end connected with each of the at least one second semiconductor chip, and a control end configured to receive a control signal for controlling the switch protection circuit to be in an off state or an on state, wherein:

a state of the control signal is determined based on whether a pin of the semiconductor package is undergoing a charged device model (CDM) discharge, the control signal comprises a first state indicating a CDM discharge at the pin and a second state indicating a normal operation of the semiconductor package; and when the switch protection circuit is fed with the control signal of the first state indicative of a CDM discharge, the switch protection circuit is in an off state to disconnect the first semiconductor chip and the at least one second semiconductor chip.

* * * * *